United States Patent
Hamada et al.

(10) Patent No.: US 9,032,977 B2
(45) Date of Patent: May 19, 2015

(54) SUBSTRATE PROCESSING METHOD

(71) Applicants: Tetsuya Hamada, Kyoto (JP); Takashi Taguchi, Kyoto (JP)

(72) Inventors: Tetsuya Hamada, Kyoto (JP); Takashi Taguchi, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 0 days.

(21) Appl. No.: 14/106,215

(22) Filed: Dec. 13, 2013

(65) Prior Publication Data
US 2014/0106281 A1 Apr. 17, 2014

Related U.S. Application Data

(62) Division of application No. 12/725,981, filed on Mar. 17, 2010, now Pat. No. 8,631,809.

(30) Foreign Application Priority Data

Mar. 18, 2009 (JP) .................................. 2009-066808

(51) Int. Cl.
*G03F 7/20* (2006.01)
*H01L 21/67* (2006.01)
(Continued)

(52) U.S. Cl.
CPC ............ *G03F 7/20* (2013.01); *H01L 21/67178* (2013.01); *H01L 21/67225* (2013.01);
(Continued)

(58) Field of Classification Search
CPC .................. H01L 21/67178; H01L 21/6715; H01L 21/67184; H01L 21/67225; H01L 21/67051

USPC ........ 396/611, 571, 572, 604; 355/27, 53, 77, 355/30; 118/52, 58, 66, 500, 320, 326; 134/61, 1, 133, 34, 56 R
See application file for complete search history.

(56) References Cited

U.S. PATENT DOCUMENTS

| 6,089,763 A | 7/2000 | Choi et al. ..................... 396/611 |
| 6,253,118 B1 | 6/2001 | Koyama ......................... 700/218 |

(Continued)

FOREIGN PATENT DOCUMENTS

| JP | 11-111800 | 4/1999 |
| JP | 11-150065 | 6/1999 |

(Continued)

OTHER PUBLICATIONS

Notice of Reasons for Refusal for Japanese Patent Application No. 2009-066808, dated Mar. 19, 2013.
(Continued)

*Primary Examiner* — Michael Barr
*Assistant Examiner* — Thomas Bucci
(74) *Attorney, Agent, or Firm* — Ostrolenk Faber LLP

(57) ABSTRACT

A method for processing a plurality of substrates after forming a photosensitive film on each substrate includes carrying each substrate into a placement buffer including a plurality of supporters by a first transport mechanism; taking out each substrate from the placement buffer to an interface by a second transport mechanism; carrying each substrate into the exposure device; carrying each substrate out of the exposure device into the placement buffer by the second transport mechanism; taking out each substrate from the placement buffer to the processing section by the first transport mechanism; performing development processing on each substrate; making each substrate stand by at the placement buffer based on timing at which the exposure device can accept each substrate; and making each substrate stand by at the placement buffer based on timing at which the developing device can accept each substrate.

6 Claims, 17 Drawing Sheets

(51) Int. Cl.
*H01L 21/673* (2006.01)
*H01L 21/677* (2006.01)

(52) U.S. Cl.
CPC .... *H01L21/67303* (2013.01); *H01L 21/67742* (2013.01); *H01L 21/67748* (2013.01); *Y10S 134/902* (2013.01)

(56) References Cited

U.S. PATENT DOCUMENTS

| | | | |
|---|---|---|---|
| 7,229,240 B2 * | 6/2007 | Hashinoki et al. | 414/147 |
| 7,641,404 B2 | 1/2010 | Hamada | |
| 2003/0213431 A1 | 11/2003 | Fukutomi et al. | |
| 2006/0177586 A1 | 8/2006 | Ishida et al. | |
| 2007/0056514 A1 * | 3/2007 | Akimoto et al. | 118/716 |
| 2007/0166031 A1 | 7/2007 | Hamada | |
| 2007/0172233 A1 | 7/2007 | Hamada | |
| 2007/0177869 A1 | 8/2007 | Yamamoto et al. | |
| 2009/0000543 A1 | 1/2009 | Fukutomi et al. | 118/58 |
| 2010/0300353 A1 | 12/2010 | Akimoto et al. | |
| 2010/0326353 A1 | 12/2010 | Akimoto et al. | |
| 2012/0145073 A1 | 6/2012 | Fukutomi et al. | 118/58 |
| 2012/0145074 A1 | 6/2012 | Fukutomi et al. | 118/58 |
| 2012/0156380 A1 | 6/2012 | Fukutomi et al. | 118/58 |

FOREIGN PATENT DOCUMENTS

| | | |
|---|---|---|
| JP | 2001-168004 | 6/2001 |
| JP | 2003-324139 | 11/2003 |
| JP | 2004-014966 | 1/2004 |
| JP | 2004-200726 | 7/2004 |
| JP | 2005-243776 | 9/2005 |
| JP | 2005-294520 | 10/2005 |
| JP | 2006-216614 | 8/2006 |
| JP | 2006-222158 | 8/2006 |
| JP | 2007-36122 | 2/2007 |
| JP | 2007-189138 | 7/2007 |
| JP | 2007-201078 | 8/2007 |
| JP | 2007-214365 | 8/2007 |
| JP | 2008-288498 | 11/2008 |
| JP | 2009-10291 | 1/2009 |

OTHER PUBLICATIONS

Notice of Reasons for Refusal dated Nov. 4, 2014 for Japanese Application No. 2014-007244 (4 pages).

* cited by examiner

F I G. 1 0
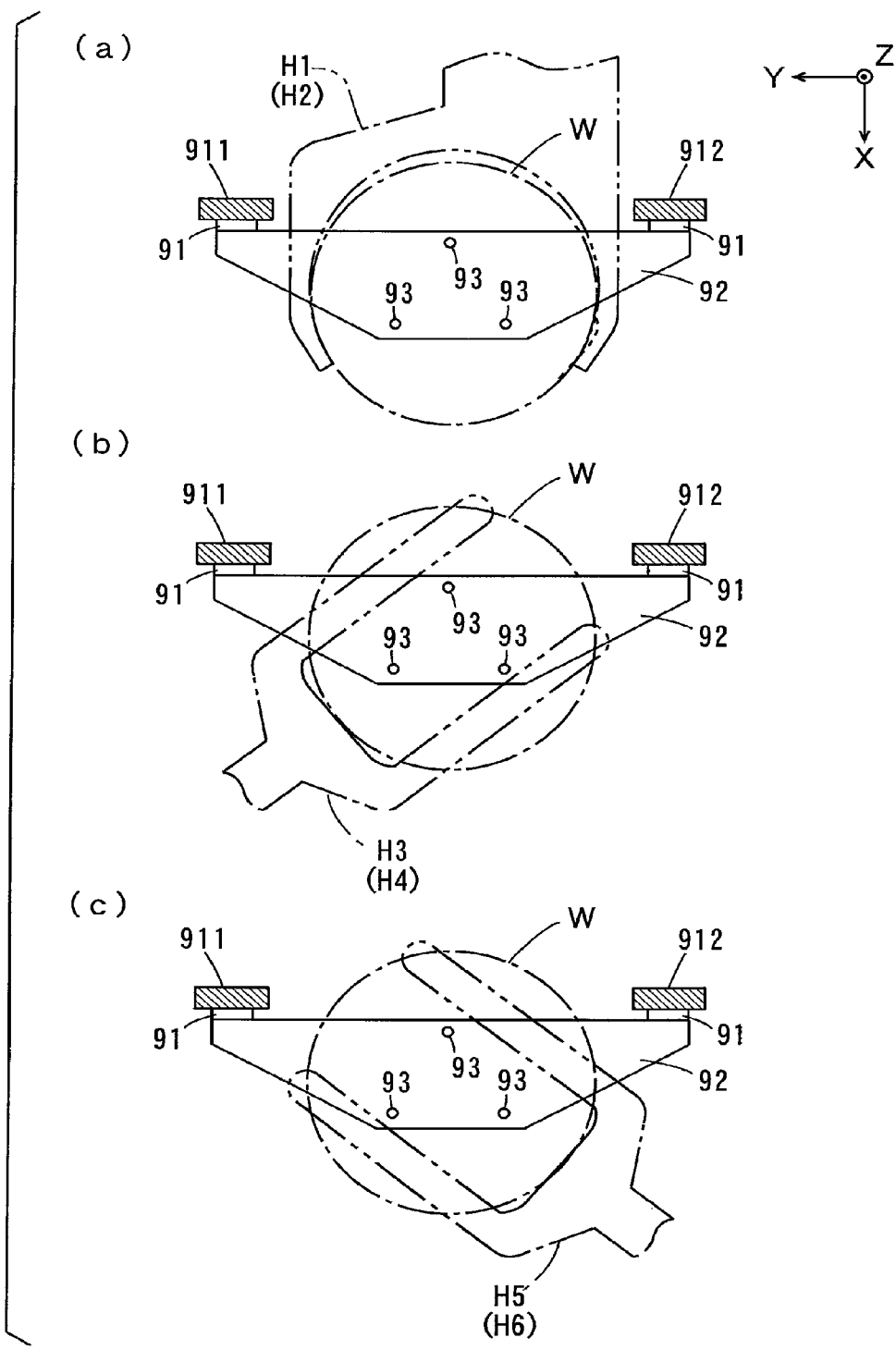

F I G. 1 3
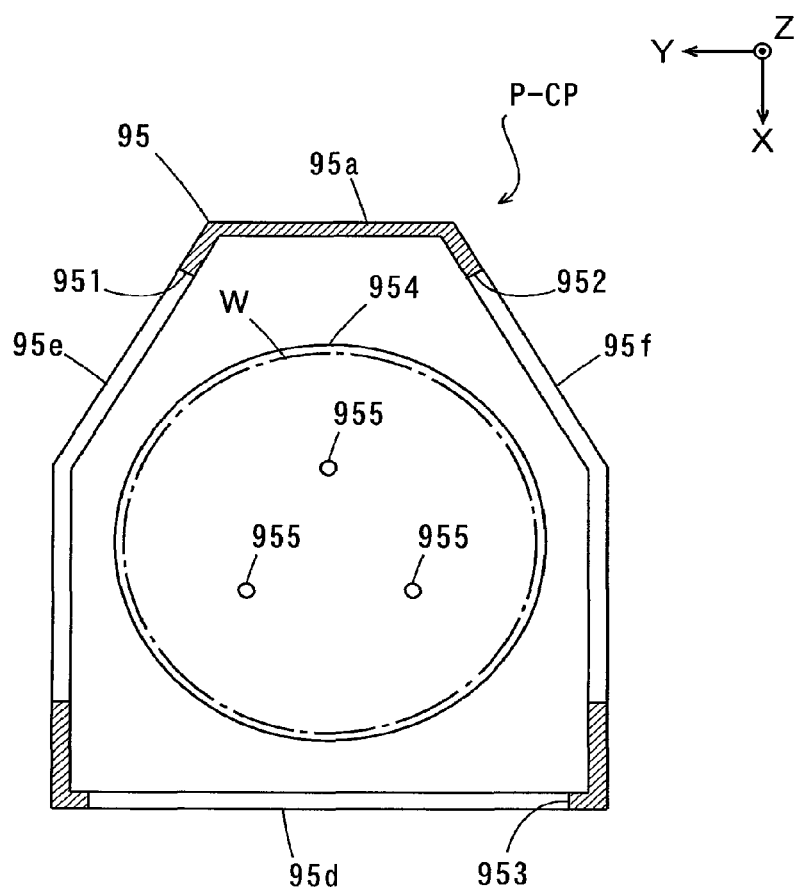

SUBSTRATE PROCESSING METHOD

BACKGROUND OF THE INVENTION

1. Field of the Invention

The present invention relates to a substrate processing apparatus that subjects substrates to various types of processing.

2. Description of the Background Art

Substrate processing apparatuses are used to subject various types of substrates such as semiconductor substrates, substrates for liquid crystal displays, plasma displays, optical disks, magnetic disks, magneto-optical disks, and photomasks, and other substrates to various types of processing.

For example, a substrate processing apparatus described in JP 2003-324139 A includes a plurality of processing blocks. Each processing block is provided with a plurality of thermal processing sections, a plurality of chemical solution processing sections and a transport mechanism. In each processing block, substrates are transported to the thermal processing sections and the chemical solution processing sections by the transport mechanism. Then, the substrates are subjected to predetermined processing in the thermal processing sections and the chemical solution processing sections.

More improved throughput of each processing block is required for improving throughput of the substrate processing apparatus. Examples of the method of improving the throughput of each processing block include reducing a time period required for transporting the substrates by the transport mechanism.

However, it is difficult to further speed up transportation of the substrates, because the transport speed of the substrates by the transport mechanism has been set sufficiently high.

SUMMARY OF THE INVENTION

An object of the present invention is to provide a substrate processing apparatus in which throughput can be improved.

(1) According to an aspect of the present invention, a substrate processing apparatus that is arranged adjacent to an exposure device includes a processing section that subjects a substrate to processing, an interface that is arranged between the processing section and the exposure device, subjects the substrate to processing, and carries the substrate in and out of the exposure device, and a first placement section that is arranged between the processing section and the interface and in which the substrate is to be placed, wherein the interface includes first and second processing regions for subjecting the substrate to the processing, a first substrate transport mechanism that is configured to transport the substrate among the first placement section, the first processing region and the exposure device, and a second substrate transport mechanism that is configured to transport the substrate among the first placement section, the second processing region and the exposure device.

In the substrate processing apparatus, the substrate is subjected to the predetermined processing in the processing section, and subsequently transported to the interface through the first placement section. Then, the substrate is carried from the interface into the exposure device. The substrate subjected to exposure processing in the exposure device is transported to the interface. At least one of a substrate before the exposure processing and a substrate after the exposure processing is subjected to the predetermined processing in the first and second processing regions in the interface.

In this case, the substrate can be transported by the first substrate transport mechanism among the first placement section, the first processing region and the exposure device. In addition, the substrate can be transported by the second substrate transport mechanism among the first placement section, the second processing region and the exposure device. This allows a wider choice of transport paths of the substrate to be available in the interface.

Accordingly, the substrate can be transported through an optimum path depending on how the substrate is to be processed in the processing section and the first and second processing regions. This allows transport efficiency of the substrate to be increased, resulting in improved throughput.

(2) The first and second processing regions may each include at least one of a cleaning processing unit that subjects a substrate before exposure processing to cleaning processing and a drying processing unit that subjects a substrate after the exposure processing to drying processing.

In this case, the substrate before the exposure processing is subjected to the cleaning processing by the cleaning processing unit to prevent contamination in the exposure device.

Moreover, the drying processing unit subjects the substrate after the exposure processing to the drying processing. Therefore, even though a liquid adheres to the substrate in the exposure device, the liquid can be prevented from dropping in the substrate processing apparatus. Also, components on the substrate can be prevented from being eluted in the liquid adhering to the substrate, and dust or the like in an atmosphere can be prevented from adhering to the liquid that adheres to the substrate.

(3) The first substrate transport mechanism may transport a substrate before exposure processing, and the second substrate transport mechanism may transport a substrate after the exposure processing.

In this case, an independent transport path is ensured for each of the substrate before the exposure processing and the substrate after the exposure processing in the interface. Thus, the substrate can be more efficiently transported than the case of complicated transport paths for the substrate before the exposure processing and the substrate after the exposure processing, resulting in the improved throughput.

Moreover, the substrate before the exposure processing and the substrate after the exposure processing do not come into indirect contact with each other in the interface. This prevents cross-contamination between the substrate before the exposure processing and the substrate after the exposure processing.

(4) The first placement section may be configured such that a plurality of substrates can be placed in the first placement section.

In this case, the substrates are temporarily housed in the first placement section to easily adjust the transport speed of the substrate.

(5) The interface may include a processing block for subjecting the substrate to the processing, a carry-in/carry-out block for carrying the substrate in and out of the exposure device, and a second placement section that is arranged between the processing block and the carry-in/carry-out block and in which the substrate is to be placed, the first and second processing regions may be provided in the processing block, the first substrate transport mechanism may include a first substrate holder that is provided in the processing block and configured to hold and transport the substrate among the first placement section, the first processing region and the second placement section, and a second substrate holder that is provided in the carry-in/carry-out block and configured to hold and transport the substrate between the second placement section and the exposure device, and the second substrate transport mechanism may include a third substrate holder that is configured to hold and transport the substrate among the first placement section, the second processing region and the second placement section in the processing block, and a fourth substrate holder that is provided in the carry-in/carry-out block and configured to hold and transport the substrate between the second placement section and the exposure device.

In this case, the substrate can be held and transported among the first placement section, the first processing region and the second placement section by the first substrate holder, and the substrate can be held and transported among the first placement section, the second processing region and the second placement section by the third substrate holder in the processing block. In addition, the substrate can be held and transported between the second placement section and the exposure device by the second and fourth substrate holders in the carry-in/carry-out block.

This allows a wider choice of transport paths of the substrate to be available in the processing block. In addition, the substrate can be carried in and out of the exposure device with simple operation in the carry-in/carry-out block. Therefore, the transport path of the substrate in the processing block is optimized to easily improve the transport efficiency of the substrate.

(6) The first substrate transport mechanism may include a first transport device that is provided in the processing block and includes the first substrate holder, and a second transport device that is provided in the processing block and includes the third substrate holder, the processing section, the processing block, the carry-in/carry-out block and the exposure device may be provided side by side along a first direction, the first and second processing regions and the first and second transport devices may be arranged along a second direction perpendicular to the first direction within a horizontal plane in the processing block, and the first and second transport devices may be arranged between the first and second processing regions, and the first transport device may be arranged on a side of the first processing region and the second transport device may be arranged on a side of the second processing region.

In this case, an increase in the size of the substrate processing apparatus can be suppressed while the transport efficiency of the substrate in the interface can be reliably improved.

(7) The processing section may include a plurality of processing chambers that are hierarchically provided, a plurality of liquid processing units that are provided in the plurality of processing chambers, respectively, and each subject the substrate to liquid processing, a plurality of transport chambers that are hierarchically provided, and a plurality of transport mechanisms for the transport chambers that are provided in the plurality of transport chambers, respectively, and each transport the substrate.

In this case, the substrates are subjected to the liquid processing by the plurality of liquid processing units in the plurality of processing chambers. Moreover, the substrates after the liquid processing are transported by the plurality of transport mechanisms for the transport chambers in the plurality of transport chambers. Accordingly, the substrates can be concurrently processed and transported by the plurality of liquid processing units and the plurality of transport mechanisms for the transport chambers, thus improving the throughput of the substrate processing apparatus.

Moreover, the plurality of processing chambers are hierarchically provided and the plurality of transport chambers are hierarchically provided, thereby making it possible to provide the plurality of liquid processing chambers and the plurality of transport chambers without increasing footprint of the substrate processing apparatus.

(8) The plurality of processing chambers may include a first processing chamber group and a second processing chamber group, the plurality of transport chambers may include a first transport chamber and a second transport chamber, and the first transport chamber may be provided adjacent to the first processing chamber group, and the second transport chamber may be provided adjacent to the second processing chamber group.

In this case, the substrate processed in the first processing chamber group can be transported by the transport mechanism for the transport chamber in the first transport chamber, and the substrate processed in the second processing chamber group can be transported by the transport mechanism for the transport chamber in the second transport chamber. This allows the plurality of substrates to be smoothly distributed to the first and second processing chamber groups, thus sufficiently improving the throughput of the substrate processing apparatus.

Even when one transport mechanism for the transport chamber of the transport mechanisms for the transport chambers in the first and second transport chambers is stopped because of malfunction, a maintenance operation and so on, the substrates can be continuously transported and processed using the other transport mechanism for the transport chamber and the liquid processing unit of the processing chamber group corresponding to the transport mechanism for the transport chamber.

Furthermore, even when the use of one processing chamber group of the first and second processing chamber groups is stopped because of malfunction, a maintenance operation and so on, the substrates can be continuously processed and transported using the liquid processing unit of the other processing chamber group and the transport mechanism for the transport chamber corresponding to the processing chamber group.

(9) The first placement section may include a first placement portion that is provided between the first transport chamber and the interface, and a second placement portion that is provided between the second transport chamber and the interface, the plurality of transport mechanisms for the transport chambers may include a first in-chamber transport mechanism that is provided in the first transport chamber, a second in-chamber transport mechanism that is provided in the second transport chamber, the first in-chamber transport mechanism may be configured to transport the substrate to the first placement portion, and the second in-chamber transport mechanism may be configured to transport the substrate to the second placement portion.

In this case, the substrate processed in the first processing chamber group can be transported to the first placement portion by the first in-chamber transport mechanism, and the substrate processed in the second processing chamber group can be transported to the second placement portion by the second in-chamber transport mechanism. In addition, the substrates can be transported by the first and second substrate transport mechanisms between the first and second placement portions and the exposure device. As a result, the substrates can be smoothly transported among the first and second processing chamber groups, the interface and the exposure device.

According to the present invention, the transport efficiency of the substrates can be improved and the throughput can be improved.

Other features, elements, characteristics, and advantages of the present invention will become more apparent from the following description of preferred embodiments of the present invention with reference to the attached drawings.

BRIEF DESCRIPTION OF THE DRAWINGS

FIG. 10 is a plan view for explaining an operation of carrying a substrate W in and out of the placement/buffer section.

FIG. 13 is a schematic transverse sectional view of the placement/cooling section.

DESCRIPTION OF THE PREFERRED EMBODIMENTS

A substrate processing apparatus according to embodiments of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask or the like.

(1) Configuration of Substrate Processing Apparatus

Figure 1:
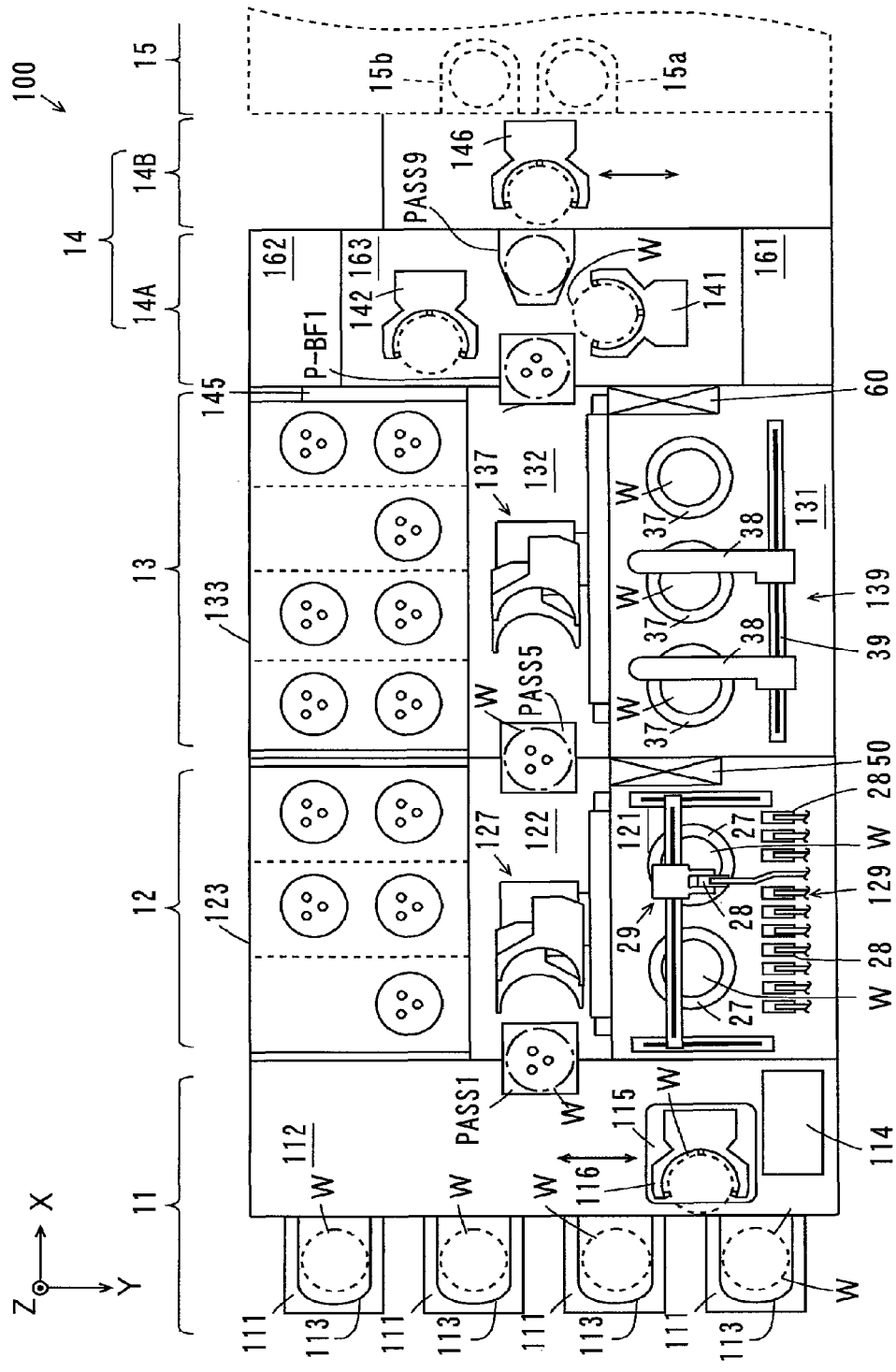
FIG. 1 is a plan view of a substrate processing apparatus according to an embodiment of the present invention.

FIG. 1 is a plan view of a substrate processing apparatus according to an embodiment of the present invention.

FIG. 1 and the following predetermined drawings are accompanied by arrows that respectively indicate X, Y, and Z directions perpendicular to one another for clarity of a positional relationship. The X and Y directions are perpendicular to each other within a horizontal plane, and the Z direction corresponds to a vertical direction. In each of the directions, the direction of the arrow is defined as a + direction, and the opposite direction is defined as a − direction.

As shown in FIG. 1, the substrate processing apparatus 100 includes an indexer block 11, a first processing block 12, a second processing block 13, a cleaning/drying processing block 14A and a carry-in/carry-out block 14B. The cleaning/drying processing block 14A and the carry-in/carry-out block 14B constitute an interface block 14. An exposure device 15 is arranged adjacent to the carry-in/carry-out block 14B. The exposure device 15 subjects a substrate W to exposure processing by means of a liquid immersion method.

As shown in FIG. 1, the indexer block 11 includes a plurality of carrier platforms 111 and a transport section 112. A carrier 113 that houses a plurality of substrates W in multiple stages is placed on each carrier platform 111. Although FOUPs (Front Opening Unified Pods) are adopted as the carriers 113 in the present embodiment, the present invention is not limited to the same. For example, SMIF (Standard Mechanical Inter Face) pods, or OCs (Open Cassettes) that expose the hosued substrates W to outside air may be used.

A controller 114 and a transport mechanism 115 are provided in the transport section 112. The controller 114 controls various components in the substrate processing apparatus 100. The transport mechanism 115 has a hand 116 for holding the substrate W. The transport mechanism 115 holds and transports the substrate W using the hand 116. In addition, an opening 117 through which the substrates W are received and transferred between the carriers 113 and the transport mechanism 115 is formed in the transport section 112 as described below referring to FIG. 5.

The first processing block 12 includes a coating processing section 121, a transport section 122 and a thermal processing section 123. The coating processing section 121 and the thermal processing section 123 are provided to be opposite to each other with the transport section 122 sandwiched therebetween. A substrate platform PASS1 and substrate platforms PASS2 to PASS4 (see FIG. 5), described later, on which the substrates W are to be placed, are provided between the transport section 122 and the indexer block 11. A transport mechanism 127 that transports the substrates W and a transport mechanism 128 (see FIG. 5), described below, are provided in the transport section 122.

The second processing block 13 includes a coating/development processing section 131, a transport section 132 and a thermal processing section 133. The coating/development processing section 131 and the thermal processing section 133 are provided to be opposite to each other with the transport section 132 sandwiched therebetween. A substrate platform PASS5 and substrate platforms PASS6 to PASS8 (see FIG. 5), described below, on which the substrates W are to be placed are provided between the transport section 132 and the transport section 122. A transport mechanism 137 and a transport mechanism 138 (see FIG. 5), described below, that transport the substrates W are provided in the transport section 132. A gasket 145 is provided between the thermal processing section 133 and the interface block 14 in the second processing block 13.

The cleaning/drying processing block 14A includes cleaning/drying processing sections 161, 162 and a transport section 163. The cleaning/drying processing sections 161, 162 are provided to be opposite to each other with the transport section 163 sandwiched therebetween. Transport mechanisms 141, 142 are provided in the transport section 163.

A placement/buffer section P-BF1 and a placement/buffer section P-BF2 (see FIG. 5), described below, are provided between the transport section 163 and the transport section 132. The placement/buffer sections P-BF1, P-BF2 are configured to house the plurality of substrates W therein.

Moreover, a substrate platform PASS9 and placement/cooling sections P-CP (see FIG. 5) that are described below are provided between the transport mechanisms 141, 142 so as to be adjacent to the carry-in/carry-out block 14B. The placement/cooling sections P-CP each have a function of cooling the substrates W (a cooling plate, for example). The substrates W are cooled to a temperature suitable for the exposure processing in the placement/cooling sections P-CP.

A transport mechanism 146 is provided in the carry-in/carry-out block 14B. The transport mechanism 146 carries the substrates W in and out of the exposure device 15. A substrate carry-in section 15a for carrying the substrate W in and a substrate carry-out section 15b for carrying the substrate W out are provided in the exposure device 15. Note that the substrate carry-in section 15a and the substrate carry-out section 15b of the exposure device 15 may be arranged to be adjacent to each other in a horizontal direction or may be arranged one above the other.

Here, the carry-in/carry-out block 14B is provided to be movable in a +Y direction and a −Y direction with respect to the cleaning/drying processing block 14A. The carry-in/carry-out block 14B can be moved in a +Y direction or a −Y direction to ensure a working space for maintenance operation of the cleaning/drying processing block 14A, the carry-in/carry-out block 14B and the exposure device 15. Note that the carry-in/carry-out block 14B can be easily moved because of its lighter weight than the other blocks.

Note that a significant amount of liquid (a cleaning liquid and a rinse liquid, for example) is used in the cleaning/drying processing sections 161, 162 in the cleaning/drying processing bock 14A. Therefore, the cleaning/drying processing block 14A needs to be reliably connected to equipment for supplying the liquid. Meanwhile, liquid is hardly used in the carry-in/carry-out block 14B. Therefore, the carry-in/carry-out block 14B can be connected to the equipment in a simplified manner. That is, the carry-in/carry-out block 14B can be easily separated from and reconnected to the equipment.

Accordingly, only the carry-in/carry-out block 14B is moved while the cleaning/drying processing block 14A is not moved at the time of the maintenance operation of the cleaning/drying processing block 14A, the carry-in/carry-out block 14B and the exposure device 15, thus significantly reducing the labor of workers and working time.

Figure 2:
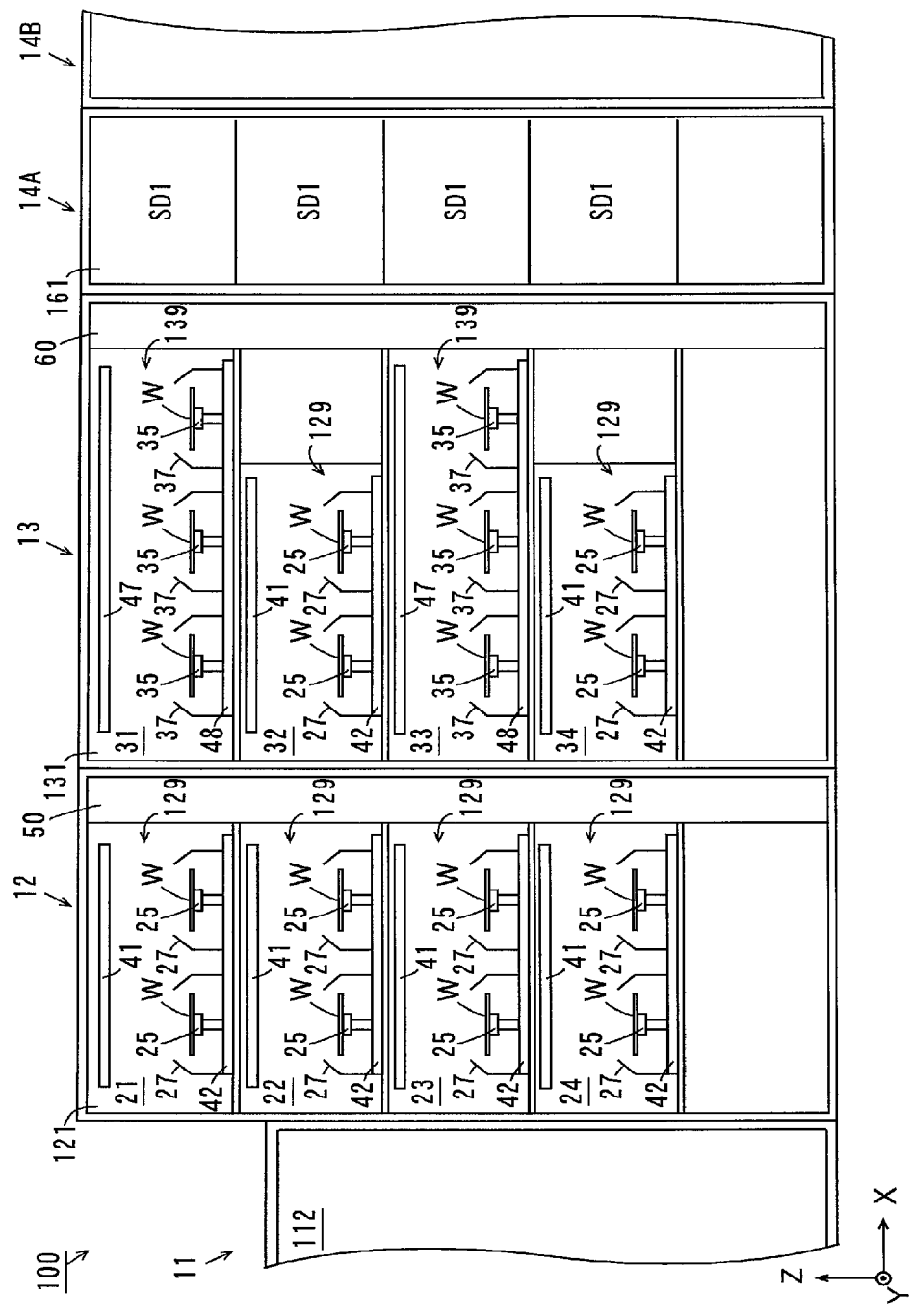
FIG. 2 is a diagram of a coating processing section, a coating/development processing section and a cleaning/drying processing section of FIG. 1 that are seen from a +Y direction.

(2) Configurations of the Coating Processing Section and the Development Processing Section FIG. 2 is a diagram of the coating processing section 121, the coating/development processing section 131 and the cleaning/drying processing section 161 of FIG. 1 that are seen from the +Y direction.

As shown in FIG. 2, coating processing chambers 21, 22, 23, 24 are hierarchically provided in the coating processing section 121. A coating processing unit 129 is provided in each of the coating processing chambers 21 to 24. Development processing chambers 31, 33 and coating processing chambers 32, 34 are hierarchically provided in the coating/development processing section 131. A development processing unit 139 is provided in each of the development processing chambers 31, 33 and a coating processing unit 129 is provided in each of the coating processing chambers 32, 34.

Each coating processing unit 129 includes spin chucks 25 that hold the substrates W and cups 27 provided to cover the periphery of the spin chucks 25. In the present embodiment, each coating processing unit 129 is provided with two spin chucks 25 and two cups 27. The spin chucks 25 are rotated by a driving device (an electric motor, for example) that is not shown.

In addition, each coating processing unit 129 includes a plurality of nozzles 28 that discharge processing liquid and a nozzle transport mechanism 29 that transports the nozzles 28 as shown in FIG. 1.

In the coating processing unit 129, any one of the plurality of nozzles 28 is moved above the substrate W by the nozzle transport mechanism 29. The processing liquid is then discharged from the nozzle 28 to be applied onto the substrate W. Note that the spin chuck 25 is rotated by the driving device, not shown, when the processing liquid is supplied from the nozzle 28 onto the substrate W, thus causing the substrate W to be rotated.

In the present embodiment, a processing liquid for an anti-reflection film is supplied from the nozzles 28 onto the substrates W in the coating processing units 129 of the coating processing chambers 22, 24. A processing liquid for a resist film is supplied from the nozzles 28 onto the substrates W in the coating processing units 129 of the coating processing chambers 21, 23. A processing liquid for a resist cover film is supplied from the nozzles 28 onto the substrates W in the coating processing units 129 of the coating processing chambers 32, 34.

Similarly to the coating processing unit 129, each development processing unit 139 includes the spin chucks 35 and the cups 37 as shown in FIG. 2. Each development processing unit 139 includes two slit nozzles 38 that discharge development liquids and a moving mechanism 39 that moves the slit nozzles 38 in the X direction as shown in FIG. 1.

In the development processing unit 139, first, one slit nozzle 38 supplies the development liquid onto each substrate W while moving in the X direction. Then, the other slit nozzle 38 supplies the development liquid onto each substrate W while moving. Note that the spin chucks 35 are rotated by the driving device, not shown, when the development liquid is supplied from the slit nozzles 38 onto the substrates W to cause the substrates W to be rotated.

In the present embodiment, the development liquid is supplied onto the substrates W, so that the resist cover films on the substrates W are removed and the development processing is performed to the substrates W in the development processing unit 139. In addition, the different development liquids are discharged from the two slit nozzles 38 in the present embodiment. Accordingly, the two kinds of development liquids can be supplied onto each substrate W.

While the coating processing unit 129 includes the two cups 27 and the development processing unit 139 includes the three cups 37 in the example of FIG. 2, the coating processing unit 129 may include three cups 27 and the development processing unit 139 may include two cups 37.

A plurality of (four in this example) cleaning/drying processing units SD1 are provided in the cleaning/drying processing section 161. The substrates W before the exposure processing are subjected to the cleaning processing and the drying processing in the cleaning/drying processing units SD1.

Note that polishing processing may be performed to a back surface of the substrate W and an end (a bevel portion) of the substrate W using a brush or the like in each cleaning/drying processing unit SD1. Here, the back surface of the substrate W means an opposite side of the surface of the substrate W on which various patterns such as a circuit pattern are to be formed.

As shown in FIG. 2, air supply units 41 for supplying clean air whose temperature and humidity are adjusted into the coating processing chambers 21 to 24, 32, 34 are provided above the coating processing units 129 in the coating processing chambers 21 to 24, 32, 34. In addition, air supply units 47 for supplying clean air whose temperature and humidity are adjusted into the development processing chambers 31, 33 are provided above the development processing units 139 in the development processing chambers 31, 33.

An exhaust unit 42 for exhausting an atmosphere within the cup 27 is provided below the coating processing unit 129 in each of the coating processing chambers 21 to 24, 32, 34. An exhaust unit 48 for exhausting an atmosphere within the cup 37 is provided below the development processing unit 139 in each of the development processing chambers 31, 33.

As shown in FIGS. 1 and 2, a fluid box 50 is provided in the coating processing section 121 so as to be adjacent to the coating/development processing section 131. Similarly, a fluid box 60 is provided in the coating/development processing section 131 so as to be adjacent to the cleaning/drying processing block 14A. The fluid box 50 and the fluid box 60 each house fluid related elements such as a pipe, a joint, a valve, a flowmeter, a regulator, a pump, a temperature adjuster used to supply a chemical solution to the coating processing units 129 and the development processing units 139 and discharge the chemical solution and air out of the coating processing units 129 and the development processing units 139.

(3) Configurations of the Thermal Processing Sections

Figure 3:
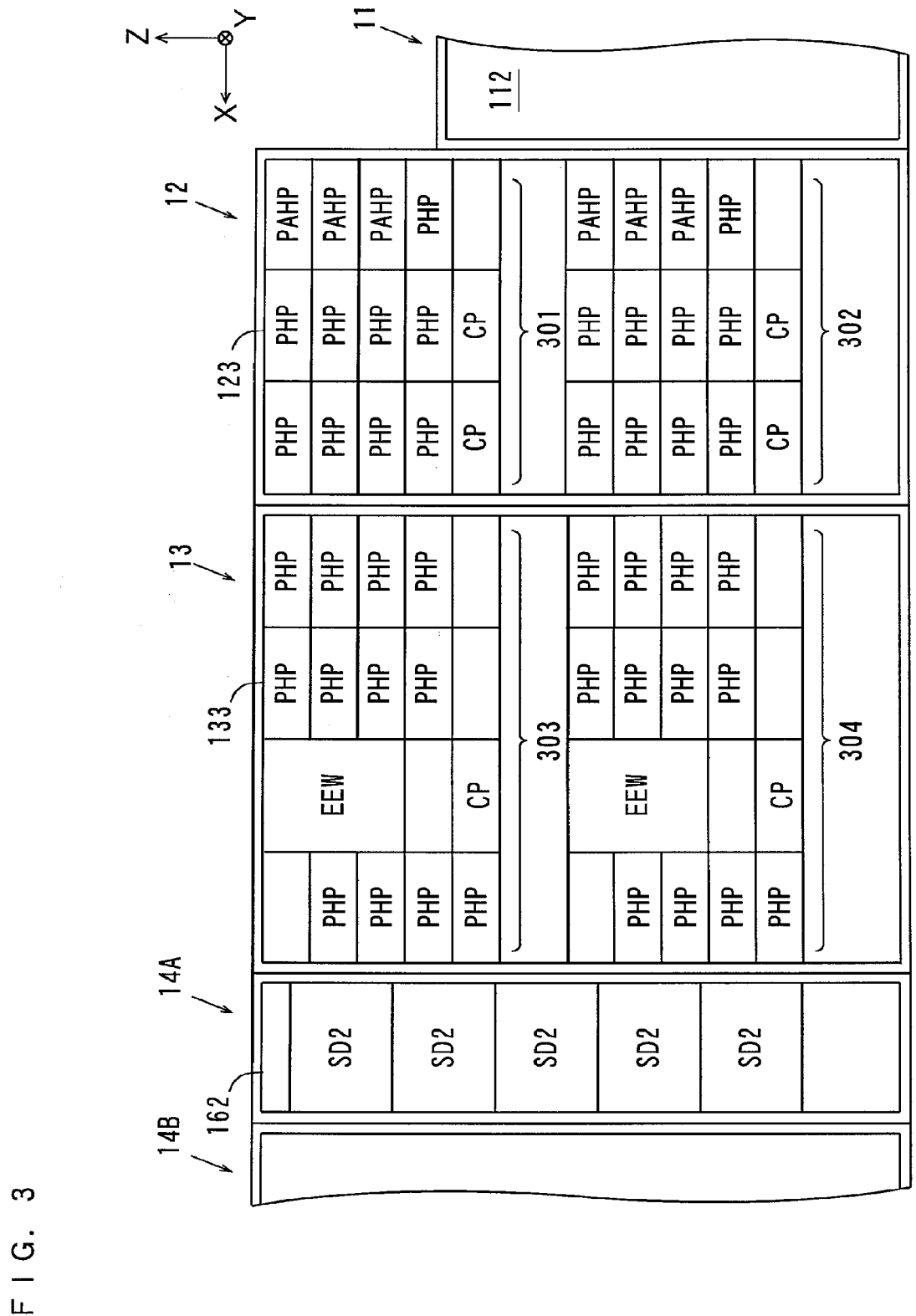
FIG. 3 is a diagram of thermal processing sections and the cleaning/drying processing section of FIG. 1 that are seen from a −Y direction.

FIG. 3 is a diagram of the thermal processing sections 122, 133 and the cleaning/drying processing section 162 of FIG. 1 that are seen from the −Y direction.

As shown in FIG. 3, the thermal processing section 123 has an upper stage thermal processing portion 301 provided above and a lower stage thermal processing portion 302 provided below. The upper stage thermal processing portion 301 and the lower stage thermal processing portion 302 are each provided with a plurality of thermal processing units PHP, a plurality of adhesion reinforcing processing units PAHP and a plurality of cooling units CP.

The substrates W are subjected to thermal processing and cooling processing in the thermal processing units PHP. Adhesion reinforcing processing for improving adhesion between the substrates W and the antireflection films is performed in the adhesion reinforcing processing units PAHP. Specifically, an adhesion reinforcing agent such as HMDS (hexametyldisilazane) is applied to the substrates W and the thermal processing is performed to the substrates W in the adhesion reinforcing processing units PAHP. In the cooling unit CP, the substrates W are subjected to cooling processing.

The thermal processing section 133 includes an upper stage thermal processing portion 303 provided above and a lower stage thermal processing portion 304 provided below. The upper stage thermal processing portion 303 and the lower stage thermal processing portion 304 are each provided with a cooling unit CP, a plurality of thermal processing units PHP and an edge exposure portion EEW. The exposure processing is performed to peripheral portions of the substrates W in the edge exposure portion EEW.

In addition, a plurality of (five in this example) cleaning/drying processing units SD2 are provided in the cleaning/drying processing section 162. The substrates W after the exposure processing are subjected to the cleaning processing and the drying processing in the cleaning/drying processing units SD2.

(4) Configuration of the Transport Sections (4-1) Schematic Configuration

Figure 4:
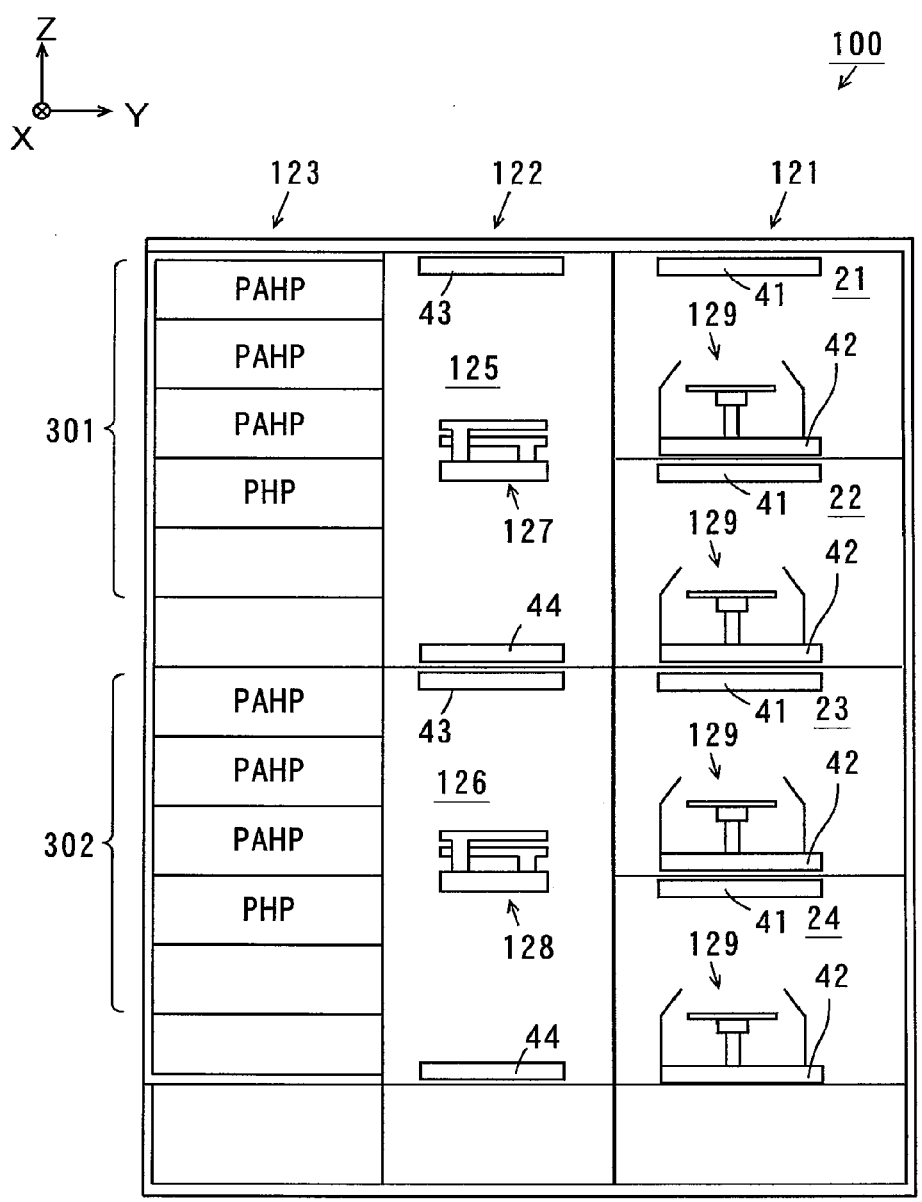
FIG. 4 is a diagram of the coating processing section, a transport section and the thermal processing section of FIG. 1 that are seen from a −X direction.
Figure 5:
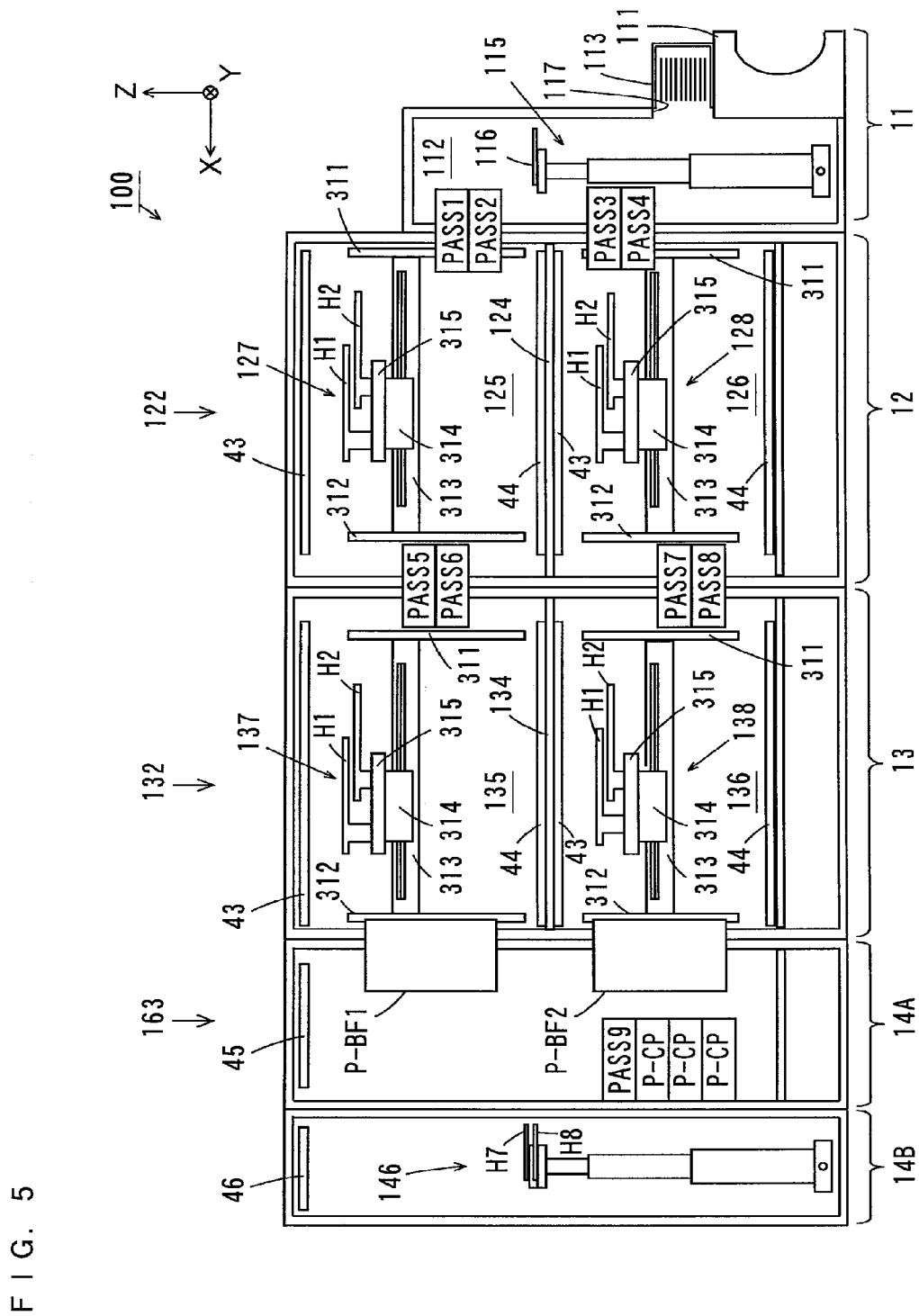
FIG. 5 is a diagram of the transport sections that are seen from the −Y direction.

FIG. 4 is a diagram of the coating processing section 121, the transport section 122 and the thermal processing section 123 of FIG. 1 that are seen from the −X direction. FIG. 5 is a diagram of the transport sections 122, 132, 163 that are seen from the −Y direction.

As shown in FIGS. 4 and 5, the transport section 122 has an upper stage transport chamber 125 and a lower stage transport chamber 126. The transport section 132 has an upper stage transport chamber 135 and a lower stage transport chamber 136.

The transport mechanism 127 is provided in the upper stage transport chamber 125 and the transport mechanism 128 is provided in the lower stage transport chamber 126. The transport mechanism 137 is provided in the upper stage transport chamber 135 and the transport mechanism 138 is provided in the lower stage transport chamber 136.

As shown in FIG. 4, the coating processing chambers 21, 22 are provided to be opposite to the upper stage thermal processing portion 301 with the upper stage transport chamber 125 sandwiched therebetween, and the coating processing chambers 23, 24 are provided to be opposite to the lower stage thermal processing portion 302 with the lower stage transport chamber 126 sandwiched therebetween. Similarly, the development processing chamber 31 and the coating processing chamber 32 (FIG. 2) are provided to be opposite to the upper stage thermal processing portion 303 (FIG. 3) with the upper stage transport chamber 135 (FIG. 5) sandwiched therebetween, and the development processing chamber 33 and the coating processing chamber 34 (FIG. 2) are provided to be opposite to the lower stage thermal processing portion 304 (FIG. 3) with the lower stage transport chamber 136 (FIG. 5) sandwiched therebetween.

As shown in FIG. 5, the substrate platforms PASS1, PASS2 are provided between the transport section 112 and the upper stage transport chamber 125, and the substrate platforms PASS3, PASS4 are provided between the transport section 112 and the lower stage transport chamber 126. The substrate platforms PASS5, PASS6 are provided between the upper stage transport chamber 125 and the upper stage transport chamber 135, and the substrate platforms PASS7, PASS8 are provided between the lower stage transport chamber 126 and the lower stage transport chamber 136.

The placement/buffer section P-BF1 is provided between the upper stage transport chamber 135 and the transport section 163, and the placement/buffer section P-BF2 is provided between the lower stage transport chamber 136 and the transport section 163. The substrate platform PASS9 and the plurality of placement/cooling sections P-CP are provided in the transport section 163 so as to be adjacent to the carry-in/carry-out block 14B.

The placement/buffer section P-BF1 is configured such that the substrates W can be carried in and out by the transport mechanism 137 and the transport mechanisms 141, 142 (FIG. 1). The placement/buffer section P-BF2 is configured such that the substrates W can be carried in and out by the transport mechanism 138 and the transport mechanisms 141, 142 (FIG. 1). The substrate platform PASS9 and the placement/cooling sections P-FP are configured such that the substrates W can be carried in and out by the transport mechanisms 141, 142 (FIG. 1) and the transport mechanism 146.

While the one substrate platform PASS9 is provided in the example of FIG. 5, a plurality of substrate platforms PASS9 may be provided one above another. In this case, the plurality of substrate platforms PASS9 may be used as buffer portions on which the substrates W are temporarily placed.

In the present embodiment, the substrates W to be transported from the indexer block 11 to the first processing block 12 are placed on the substrate platform PASS1 and the substrate platform PASS3, and the substrates W to be transported from the first processing block 12 to the indexer block 11 are placed on the substrate platform PASS2 and the substrate platform PASS4.

The substrates W to be transported from the first processing block 12 to the second processing block 13 are placed on the substrate platform PASS5 and the substrate platform PASS7, and the substrates W to be transported from the second processing block 13 to the first processing block 12 are placed on the substrate platform PASS6 and the substrate platform PASS8.

The substrates W to be transported from the second processing block 13 to the cleaning/drying processing block 14A are placed in the placement/buffer sections P-BF1, P-BF2, the substrates W to be transported from the cleaning/drying processing block 14A to the carry-in/carry-out block 14B are placed in the placement/cooling sections P-CP, and the substrates W to be transported from the carry-in/carry-out block 14B to the cleaning/drying processing block 14A is placed on the substrate platform PASS9.

An air supply unit 43 is provided above the transport mechanism 127 within the upper stage transport chamber 125, and an air supply unit 43 is provided above the transport mechanism 128 in the lower stage transport chamber 126. An air supply unit 43 is provided above the transport mechanism 137 within the upper stage transport chamber 135, and the air supply unit 43 is provided above the transport mechanism 138 within the lower stage transport chamber 136. Air whose temperature and humidity is adjusted is supplied from a temperature adjustment device, not shown, to the air supply units 43.

In addition, an exhaust unit 44 for exhausting air in the upper stage transport chamber 125 is provided below the transport mechanism 127 within the upper stage transport chamber 125, and an exhaust unit 44 for exhausting air in the lower stage transport chamber 126 is provided below the transport mechanism 128 within the lower stage transport chamber 126.

Similarly, an exhaust unit 44 for exhausting air in the upper stage transport chamber 135 is provided below the transport mechanism 137 within the upper stage transport chamber 135, and an exhaust unit 44 for exhausting air in the lower stage transport chamber 136 is provided below the transport mechanism 138 within the lower stage transport chamber 136.

Accordingly, the atmosphere in the upper stage transport chambers 125, 135 and the lower stage transport chambers 126, 136 is maintained in a clean state with suitable temperature and humidity.

An air supply unit 45 is provided in an upper portion within the transport section 163 of the cleaning/drying processing block 14A. An air supply unit 46 is provided in an upper portion within the carry-in/carry-out block 14B. Air whose temperature and humidity are adjusted is supplied from the temperature adjustment device, not shown, to the air supply units 45, 46. Accordingly, the atmosphere in the cleaning/drying processing block 14A and the carry-in/carry-out block 14B is maintained in a clean state with suitable temperature and humidity.

(4-2) Configuration of the Transport Mechanism

Figure 6:
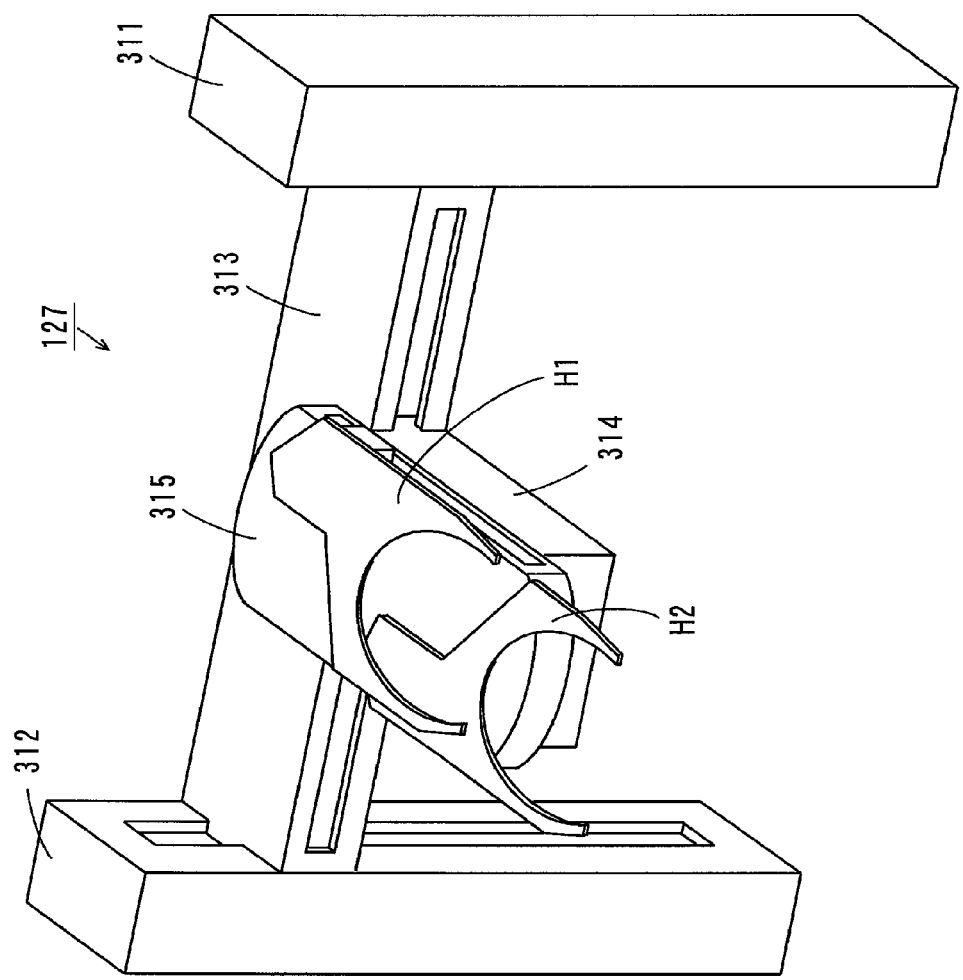
FIG. 6 is a perspective view showing a transport mechanism.

Next, description will be made of the transport mechanism 127. FIG. 6 is a perspective view showing the transport mechanism 127.

As shown in FIGS. 5 and 6, the transport mechanism 127 has long-sized guide rails 311, 312. As shown in FIG. 5, the guide rail 311 is fixed to the side of the transport section 112 to extend in the vertical direction in the upper stage transport chamber 125. The guide rail 312 is fixed to the side of the upper stage transport chamber 135 to extend in the vertical direction in the upper stage transport chamber 125.

As shown in FIGS. 5 and 6, a long-sized guide rail 313 is provided between the guide rail 311 and the guide rail 312. The guide rail 313 is attached to the guide rails 311, 312 in a vertically movable manner. A moving member 314 is attached to the guide rail 313. The moving member 314 is provided in a movable manner in a longitudinal direction of the guide rail 313.

A long-sized rotating member 315 is provided on an upper surface of the moving member 314 in a rotatable manner. A hand H1 and a hand H2 for holding the substrates W are attached to the rotating member 315. The hands H1, H2 are provided in a movable manner in a longitudinal direction of the rotating member 315.

The above-described configuration allows the transport mechanism 127 to freely move in the X direction and the Z direction within the upper stage transport chamber 125. In addition, the substrates W can be transferred among the coating processing chambers 21, 22 (FIG. 2), the substrate platforms PASS1, PASS2, PASS5, PASS6 (FIG. 5) and the upper stage thermal processing portion 301 (FIG. 3) using the hands H1, H2.

Note that the transport mechanisms 128, 137, 138 each have the same configuration as the transport mechanism 127 as shown in FIG. 5.

(5) Configuration of the Cleaning/Drying Processing Block

Figure 7:
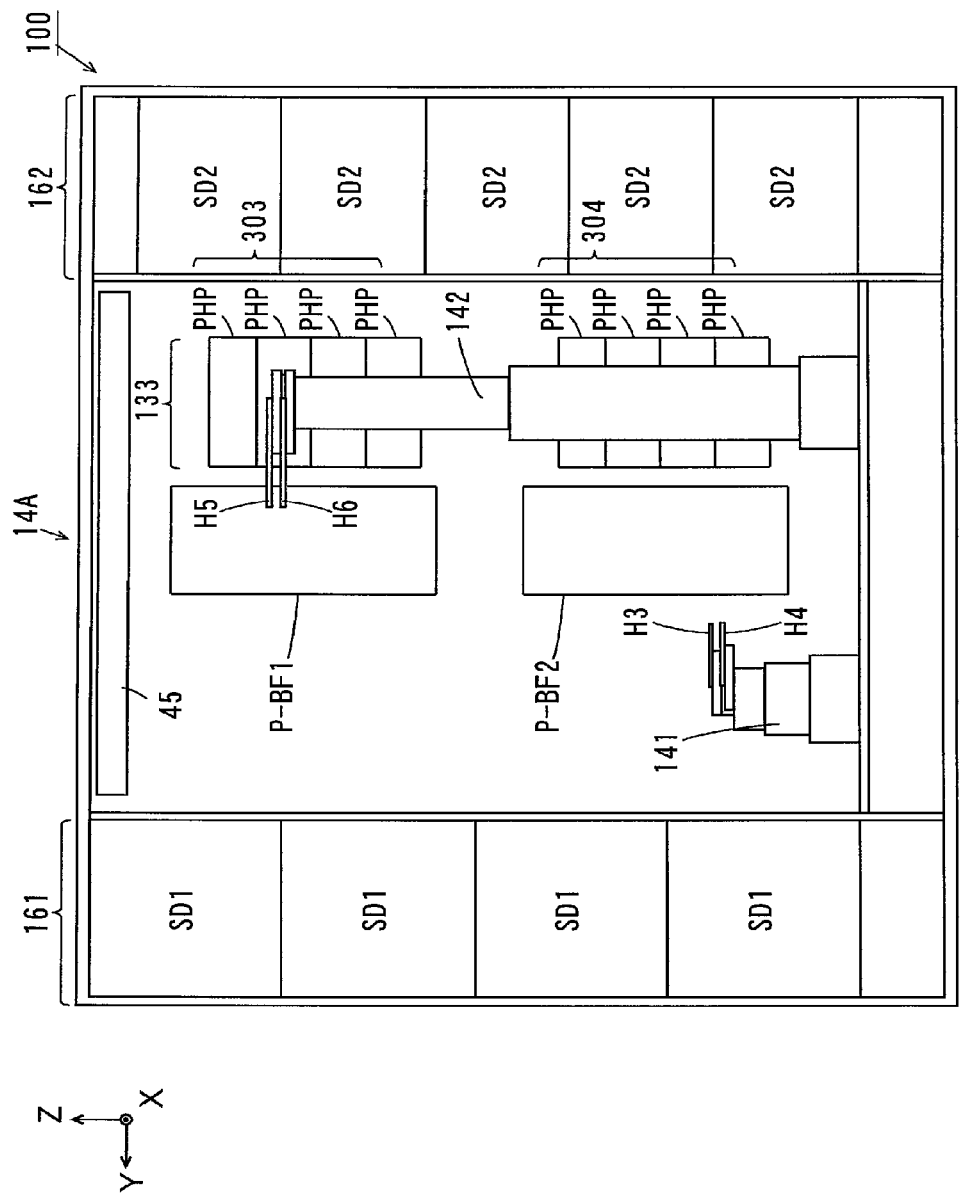
FIG. 7 is a diagram showing the internal configuration of a cleaning/drying processing block.

FIG. 7 is a diagram showing the internal configuration of the cleaning/drying processing block 14A. Note that FIG. 7 is a diagram of the cleaning/drying processing block 14A that is seen from the +X direction.

As shown in FIG. 7, the transport mechanism 141 has hands H3, H4 for holding the substrates W, and the transport mechanism 142 has hands H5, H6 for holding the substrates W.

The cleaning/drying processing units SD1 are hierarchically provided on the +Y side of the transport mechanism 141, and the cleaning/drying processing units SD2 are hierarchically provided on the −Y side of the transport mechanism 142. The placement/buffer sections P-BF1, P-BF2 are provided one above the other on the −X side between the transport mechanisms 141, 142.

The thermal processing units PHP of the upper stage thermal processing portion 303 and the lower stage thermal processing portion 304 are configured such that the substrates W can be carried in from the cleaning/drying processing block 14A.

(6) Operation of Each Component of the Substrate Processing Apparatus

Description will be made of the operation of each component of the substrate processing apparatus 100 according to the present embodiment.

(6-1) Operation of the Indexer Block 11

Description will be made of the operation of the indexer block 11 mainly referring to FIGS. 1 and 5.

First, the carriers 113 in which unprocessed substrates W are housed are placed on the carrier platforms 111 of the indexer block 11 in the substrate processing apparatus 100 according to the present embodiment. The transport mechanism 115 takes out one substrate W from the carrier 113, and transports the substrate W to the substrate platform PASS1. Then, the transport mechanism 115 takes out another unprocessed substrate W from the carrier 113, and transports the substrate W to the substrate platform PASS3 (FIG. 5).

Note that when a processed substrate W is placed on the substrate platform PASS2 (FIG. 5), the transport mechanism 115 transports the unprocessed substrate W to the substrate platform PASS1 and subsequently takes out the processed substrate W from the substrate platform PASS2. Then, the transport mechanism 115 transports the processed substrate W to the carrier 113. Similarly, when a processed substrate W is placed on the substrate platform PASS4, the transport mechanism 115 transports the unprocessed substrate W to the substrate platform PASS3, and subsequently takes out the processed substrate W from the substrate platform PASS4. Then, the processed substrate W is transported to the carrier 113 by the transport mechanism 115 to be housed in the carrier 113.

(6-2) Operation of the First Processing Block 12

Description will be made of the operation of the first processing block 12 mainly referring to FIGS. 1 to 3 and 5. Note that movement of the transport mechanisms 127, 128 in the X direction and the Z direction is not explained in the following paragraphs for simplicity.

The substrate W placed on the substrate platform PASS1 (FIG. 5) by the transport mechanism 115 (FIG. 5) is taken out by the hand H1 of the transport mechanism 127 (FIG. 5). The transport mechanism 127 places the substrate W held by the hand H2 on the substrate platform PASS2. Note that the substrate W placed on the substrate platform PASS2 by the hand H2 is the substrate W after the development processing.

Next, the transport mechanism 127 takes out the substrate W after the adhesion reinforcing processing from a predetermined adhesion reinforcing processing unit PAHP (FIG. 3) of the upper stage thermal processing portion 301 (FIG. 3) using the hand H2. The transport mechanism 127 carries the unprocessed substrate W held by the hand H1 in the adhesion reinforcing processing unit PAHP.

Next, the transport mechanism 127 takes out the substrate W after the cooling processing from a predetermined cooling unit CP of the upper stage thermal processing portion 301 (FIG. 3) using the hand H1. The transport mechanism 127 carries the substrate W after the adhesion reinforcing processing held by the hand H2 in the cooling unit CP. The substrate W is cooled to a temperature suitable for formation of the antireflection film in the cooling unit CP.

The transport mechanism 127 then takes out the substrate W after formation of the antireflection film from the spin chuck 25 (FIG. 2) of the coating processing chamber 22 (FIG. 2) using the hand H2. The transport mechanism 127 places the substrate W after the cooling processing held by the hand H1 on the spin chuck 25. The antireflection film is formed on the substrate W by the coating processing unit 129 (FIG. 2) in the coating processing chamber 22.

Next, the transport mechanism 127 takes out the substrate W after the thermal processing from a predetermined thermal processing unit PHP of the upper stage thermal processing portion 301 (FIG. 3) using the hand H1. The transport mechanism 127 carries the substrate W after formation of the antireflection film held by the hand H2 in the thermal processing unit PHP. The substrates W are successively subjected to the heating processing and the cooling processing in the thermal processing unit PHP.

The transport mechanism 127 subsequently takes out the substrate W after the cooling processing from a predetermined cooling unit CP (FIG. 3) of the upper stage thermal processing portion 301 (FIG. 4) using the hand H2. The transport mechanism 127 carries the substrate W after the thermal processing held by the hand H1 in the cooling unit CP. The substrate W is cooled to a temperature suitable for resist film forming processing in the cooling unit CP.

The transport mechanism 127 then takes out the substrate W after formation of the resist film from the spin chuck 25 (FIG. 2) of the coating processing chamber 21 (FIG. 2) using the hand H1. The transport mechanism 127 places the substrate W after the cooling processing held by the hand H2 on the spin chuck 25. The resist film is formed on the substrate W by the coating processing unit 129 (FIG. 2) in the coating processing chamber 22.

Next, the transport mechanism 127 takes out the substrate W after the thermal processing from the predetermined thermal processing unit PHP of the upper stage thermal processing portion 301 (FIG. 3) using the hand H2. The transport mechanism 127 carries the substrate W after formation of the resist film held by the hand H1 in the thermal processing unit PHP.

The transport mechanism 127 then places the substrate W after the thermal processing held by the hand H2 on the substrate platform PASS5 (FIG. 5). The transport mechanism 127 takes out the substrate W after the development processing from the substrate platform PASS6 (FIG. 5) using the hand H2. The transport mechanism 127 subsequently transports the substrate W after the development processing that has been taken out from the substrate platform PASS6 to the substrate platform PASS2 (FIG. 5).

The transport mechanism 127 repeats the foregoing processing to cause the plurality of substrates W to be successively subjected to the predetermined processing in the first processing block 12.

The transport mechanism 128 performs the same operation as the transport mechanism 127 to carry the substrates W in and out of the substrate platforms PASS3, PASS4, PASS7, PASS8 (FIG. 5), the coating processing chambers 23, 24 (FIG. 2) and the lower stage thermal processing portion 302 (FIG. 4).

As described above, the substrates W transported by the transport mechanism 127 are processed in the coating processing chambers 21, 22 and the upper stage thermal processing portion 301, and the substrates W transported by the transport mechanism 128 are processed in the coating processing chambers 23, 24 and the lower stage thermal processing portion 302 in the present embodiment. In this case, the plurality of substrates W can be simultaneously processed in the upper processing section (the coating processing chambers 21, 22 and the upper stage thermal processing portion 301) and the lower processing section (the coating processing chambers 23, 24 and the lower stage thermal processing portion 302). This improves throughput of the first processing block 12 without increasing the transport speed of the substrates W by the transport mechanisms 127, 128. The transport mechanisms 127, 128 are provided one above the other, thus preventing an increase of footprint of the substrate processing apparatus 100.

While the substrates W are subjected to the cooling processing in the cooling unit CP before the antireflection film forming processing in the coating processing chamber 22 in the foregoing example, the substrates W may not be subjected to the cooling processing in the cooling unit CP before the development processing if the antireflection film can be properly formed.

(6-3) Operation of the Second Processing Block 13

Description will be made of the operation of the second processing block 13 mainly referring to FIGS. 1 to 3 and 5. Note that movement of the transport mechanisms 137, 138 in the X direction and the Z direction is not explained in the following paragraphs for simplicity.

The substrate W placed on the substrate platform PASS5 (FIG. 5) by the transport mechanism 127 is taken out by the hand H1 of the transport mechanism 137 (FIG. 5). The transport mechanism 137 places the substrate W held by the hand H2 on the substrate platform PASS6. Note that the substrate W placed on the substrate platform PASS6 by the hand H2 is the substrate W after the development processing.

Next, the transport mechanism 137 takes out the substrate W after formation of the resist cover film from the spin chuck 25 (FIG. 2) of the coating processing chamber 32 (FIG. 2) using the hand H2. The transport mechanism 137 places the substrate W after formation of the resist film held by the hand H1 on the spin chuck 25. The resist cover film is formed on the substrate W by the coating processing unit 129 (FIG. 2) in the coating processing chamber 32.

Next, the transport mechanism 137 takes out the substrate W after the thermal processing from a predetermined thermal processing unit PHP of the upper stage thermal processing portion 303 (FIG. 3) using the hand H1. The transport mechanism 137 carries the substrate W after formation of the resist cover film held by the hand H2 in the thermal processing unit PHP.

The transport mechanism 137 then takes out the substrate W after the edge exposure processing from the edge exposure section EEW (FIG. 3) using the hand H2. The transport mechanism 137 carries the substrate W after the thermal processing held by the hand H1 in the edge exposure section EEW. The peripheral portion of the substrate W is subjected to the exposure processing in the edge exposure section EEW.

Next, the transport mechanism 137 places the substrate W after the edge exposure processing held by the hand H2 in the placement/buffer section P-BF1 (FIG. 5), and takes out the substrate W after the thermal processing from the thermal processing unit PHP of the upper stage thermal processing portion 301 (FIG. 4) adjacent to the carry-in/carry-out block 14A using the hand H2. Note that the substrate W taken out from the thermal processing unit PHP adjacent to the carry-in/carry-out block 14A is the substrate W that has been subjected to the exposure processing in the exposure device 15.

Next, the transport mechanism 137 takes out the substrate W after the cooling processing from a predetermined cooling unit CP (FIG. 3) of the upper stage thermal processing portion 303 (FIG. 3) using the hand H1. The transport mechanism 137 carries the substrate W after the exposure processing held by the hand H2 in the cooling unit CP. The substrate W is cooled to a temperature suitable for the development processing in the cooling unit CP.

The transport mechanism 137 then takes out the substrate W after the development processing from the spin chuck 35 (FIG. 2) of the development processing chamber 31 (FIG. 2) using the hand H2. The transport mechanism 137 places the substrate W after the cooling processing held by the hand H1 on the spin chuck 35. Removing processing of the resist cover film and the development processing are performed by the development processing unit 139 in the development processing chamber 31.

Next, the transport mechanism 137 takes out the substrate W after the thermal processing from a predetermined thermal processing unit PHP of the upper stage thermal processing portion 303 (FIG. 4) using the hand H1. The transport mechanism 137 carries the substrate W after the development processing held by the hand H2 to the thermal processing unit PHP. Then, the transport mechanism 137 places the substrate W taken out from the thermal processing unit PHP on the substrate platform PASS6 (FIG. 5).

The transport mechanism 137 repeats the foregoing processing to cause the plurality of substrates W to be successively subjected to the predetermined processing in the second processing block 13.

The transport mechanism 138 performs the same operation as the transport mechanism 137 to carry the substrates W in and out of the substrate platforms PASS7, PASS8, the placement/buffer section P-BF2 (FIG. 5), the development processing chamber 33 (FIG. 2), the coating processing chamber 34 (FIG. 2) and the lower stage thermal processing portion 304 (FIG. 3).

As described above, the substrates W transported by the transport mechanism 137 are processed in the development processing chamber 31, the coating processing chamber 32 and the upper stage thermal processing portion 303, and the substrates W transported by the transport mechanism 138 are processed in the development processing chamber 33, the coating processing chamber 34 and the lower stage thermal processing portion 304 in the present embodiment. In this case, the plurality of substrates W can be simultaneously processed in the upper processing section (the development processing chamber 31, the coating processing chamber 32 and the upper stage thermal processing portion 303) and the lower processing section (the development processing chamber 33, the coating processing chamber 34 and the lower stage thermal processing portion 304). This improves throughput of the second processing block 13 without increasing the transport speed of the substrates W by the transport mechanisms 137, 138. The transport mechanisms 137, 138 are provided one above the other, thus preventing an increase of footprint of the substrate processing apparatus 100.

While the substrates W are subjected to the cooling processing in the cooling unit CP before the development processing of the substrates W in the development processing chamber 31 in the foregoing example, the substrates W may not be subjected to the cooling processing in the cooling unit CP before the development processing if the development processing can be properly performed.

(6-4) Operations of the Cleaning/Drying Processing Block 14A and the Carry-In/Carry-Out Block 14B Description will be made of the operations of the cleaning/drying processing block 14A and the carry-in/carry-out block 14B mainly referring to FIGS. 5 and 7.

In the cleaning/drying processing block 14A, the transport mechanism 141 (FIG. 7) takes out the substrate W after the edge exposure placed in the placement/buffer section P-BF1 by the transport mechanism 137 (FIG. 5) using the hand H3.

Next, the transport mechanism 141 takes out the substrate W after the cleaning processing and the drying processing from the predetermined cleaning/drying processing unit SD1 of the cleaning/drying processing section 161 (FIG. 7) using the hand H4. The transport mechanism 141 carries the substrate W after the edge exposure held by the hand H3 to the cleaning/drying processing unit SD1.

The transport mechanism 141 subsequently places the substrate W after the cleaning processing and the drying processing held by the hand H4 in the placement/cooling section P-CP (FIG. 5). In the placement/cooling section P-CP, the substrate W is cooled to a temperature suitable for the exposure processing in the exposure device 15 (FIG. 1).

The transport mechanism 141 then takes out the substrate W after the edge exposure placed in the placement/buffer section P-BF2 by the transport mechanism 138 (FIG. 5) using the hand H3. The transport mechanism 141 then takes out the substrate W after the cleaning processing and the drying processing from the predetermined cleaning/drying processing unit SD1 of the cleaning/drying processing section 161 (FIG. 7) using the hand H4. The transport mechanism 141 carries the substrate W after the edge exposure held by the hand H3 in the cleaning/drying processing unit SD1. Next, the transport mechanism 141 places the substrate W after the cleaning processing and the drying processing held by the hand H4 in the placement/cooling section P-CP (FIG. 5).

In this manner, the transport mechanism 141 alternately transports the substrates W after the edge exposure placed in the placement/buffer sections P-BF1, P-BF2 to the placement/cooling sections P-CP via the cleaning/drying processing section 161.

Here, the substrates W housed in the carrier 113 (FIG. 5) are alternately transported to the substrate platforms PASS1, PASS3 (FIG. 5) by the transport mechanism 115 (FIG. 5). In addition, the processing speed of the substrates W in the coating processing chambers 21, 22 (FIG. 2) and the upper stage thermal processing portion 301 (FIG. 3) is substantially equal to that in the coating processing chambers 23, 24 (FIG. 2) and the lower stage thermal processing portion 302 (FIG. 3).

Furthermore, the operation speed of the transport mechanism 127 (FIG. 5) is substantially equal to that of the transport mechanism 128 (FIG. 5). The processing speed of the substrates W in the development processing chamber 31, the coating processing chamber 32 (FIG. 2) and the upper stage thermal processing portion 303 (FIG. 3) is substantially equal to that in the development processing chamber 33, the coating processing chamber 34 (FIG. 2) and the lower stage thermal processing portion 304 (FIG. 3). The operation speed of the transport mechanism 137 (FIG. 5) is substantially equal to that of the transport mechanism 138 (FIG. 5).

As described above, the substrates W are alternately transported by the transport mechanism 141 (FIG. 7) from the placement/buffer sections P-BF1, P-BF2 (FIG. 5) to the placement/cooling sections P-CP, so that the order of the substrates W carried from the carriers 113 into the substrate processing apparatus 100 coincides with the order of the substrates W transported from the cleaning/drying processing block 14A into the placement/cooling sections P-CP (FIG. 5). In this case, the processing history of each substrate W in the substrate processing apparatus 100 is easily controlled.

The transport mechanism 142 (FIG. 7) takes out the substrate W after the exposure processing placed in the substrate platform PASS9 (FIG. 5) by the hand H5. Next, the transport mechanism 142 takes out the substrate W after the cleaning processing and the drying processing from the predetermined cleaning/drying processing unit SD2 of the cleaning/drying processing section 162 (FIG. 7) using the hand H6. The transport mechanism 142 carries the substrate W after the exposure processing held by the hand H5 in the cleaning/drying processing unit SD2.

Next, the transport mechanism 142 transports the substrate W after the cleaning processing and the drying processing held by the hand H6 to the thermal processing unit PHP (FIG. 7) of the upper stage thermal processing portion 303. Post exposure bake (PEB) processing is performed in the thermal processing unit PHP.

The transport mechanism 142 (FIG. 7) subsequently takes out the substrate W after the exposure processing placed on the substrate platform PASS9 (FIG. 5) using the hand H5. Next, the transport mechanism 142 takes out the substrate W after the cleaning processing and the drying processing from the predetermined cleaning/drying processing unit SD2 of the cleaning/drying processing section 162 (FIG. 7) using the hand H6. The transport mechanism 142 carries the substrate W after the exposure processing held by the hand H5 in the cleaning/drying processing unit SD2.

The transport mechanism 142 then transports the substrate W after the cleaning processing and the drying processing held by the hand H6 to the thermal processing unit PHP (FIG. 7) of the lower stage thermal processing portion 304. The PEB processing is performed in the thermal processing unit PHP.

In this manner, the transport mechanism 142 alternately transports the substrates W after the exposure processing placed in the substrate platform PASS9 to the upper stage thermal processing portion 303 and the lower stage thermal processing portion 304 via the cleaning/drying processing section 162.

In the carry-in/carry-out block 14B, the transport mechanism 146 (FIG. 5) takes out the substrate W placed in the placement/cooling section P-CP using the hand H7, and transports the substrate W to the substrate carry-in section 15a of the exposure device 15. In addition, the transport mechanism 146 takes out the substrate W after the exposure processing from the substrate carry-out section 15b of the exposure device 15 using the hand H8, and transports the substrate W to the substrate platform PASS9.

Here, as described above, the order of the substrates W placed in the placement/cooling sections P-CP (FIG. 5) by the transport mechanism 141 (FIG. 7) is equal to the order of the substrates W carried from the carriers 113 (FIG. 5) into the substrate processing apparatus 100. This allows the order of the substrates W carried from the carriers 113 into the substrate processing apparatus 100 to coincide with the order of the substrates W carried in the exposure device 15 by the transport mechanism 142 (FIG. 7). Accordingly, the processing history of each substrate W in the exposure device 15 is easily controlled. In addition, variation in the state of the exposure processing among the plurality of substrates W carried from one carrier 113 to the substrate processing apparatus 100 can be prevented.

Note that when the exposure device 15 cannot receive the substrate W, the transport mechanism 141 (FIG. 7) causes the substrates W after the cleaning processing and the drying processing to be temporarily housed in the placement/buffer sections P-BF1, P-BF2.

Moreover, when the development processing unit 139 (FIG. 2) of the second processing block 13 cannot receive the substrate W after the exposure processing, the transport mechanisms 137, 138 (FIG. 5) cause the substrates W after the PEB processing to be temporarily housed in the placement/buffer sections P-BF1, P-BF2.

When the substrates W are not normally transported to the placement/buffer sections P-BF1, P-BF2 due to malfunction or the like of the first and second processing blocks 12, 13, transportation of the substrates W from the placement/buffer sections P-BF1, P-BF2 by the transport mechanism 141 may be temporarily stopped until the transportation of the substrates W is normalized.

(7) Details of the Placement/Buffer Sections

Figure 8:
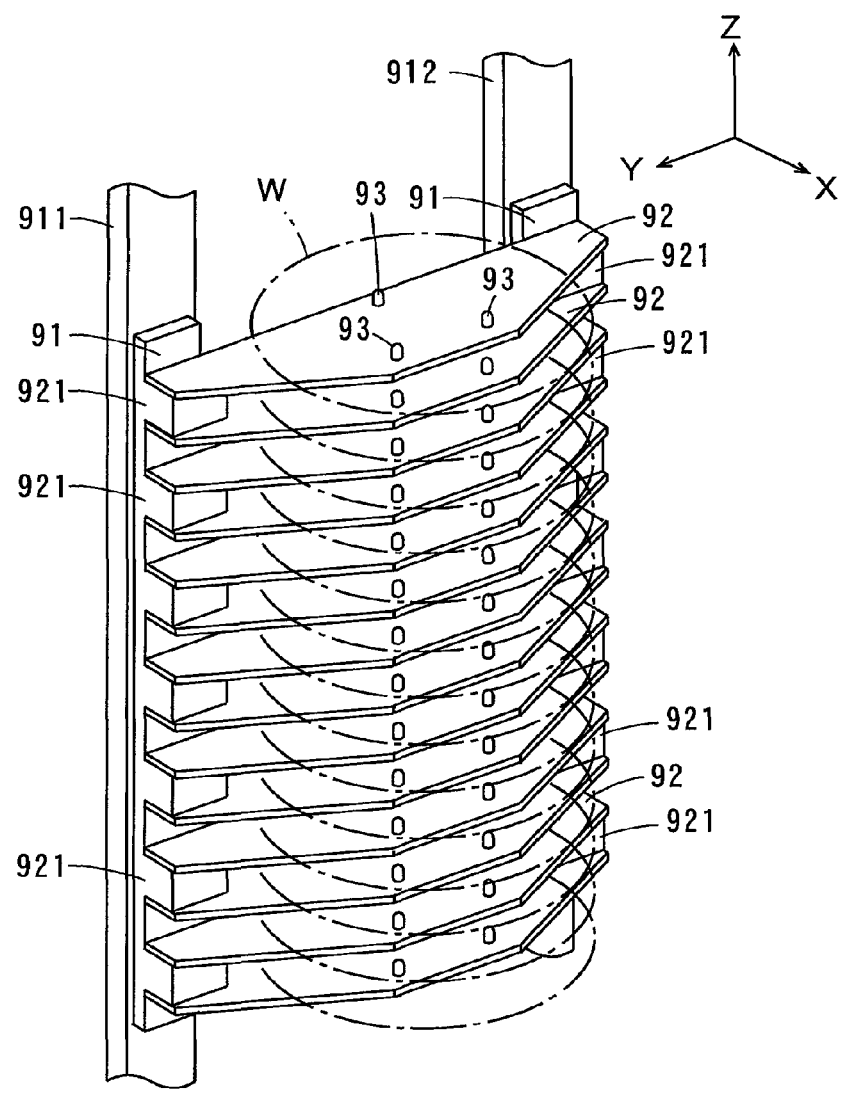
FIG. 8 is a perspective view showing the appearance of a placement/buffer section.
Figure 9:
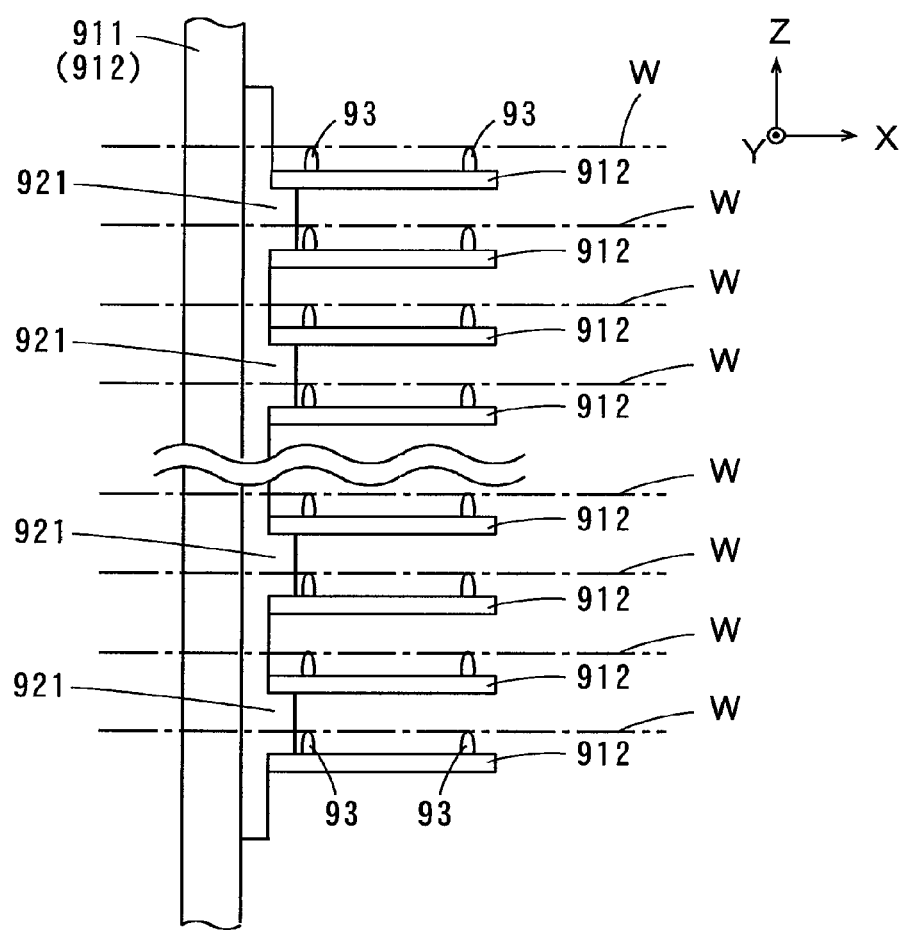
FIG. 9 is a side view of the placement/buffer section.

Next, description will be made of the detailed configurations of the placement/buffer sections P-BF1, P-BF2. FIGS. 8 and 9 are a perspective view and a side view showing the appearance of the placement/buffer section P-BF1. FIG. 10 is a plan view for explaining an operation of carrying the substrate W in and out of the placement/buffer section P-BF1. Note that the configuration of the placement/buffer section P-BF2 is the same as that of the placement/buffer section P-BF1 shown in FIGS. 8 to 10.

As shown in FIGS. 8 and 9, frames 911, 912 extending in the vertical direction (the Z direction) are provided in a boundary portion between the second processing block 13 (FIG. 1) and the cleaning/drying processing block 14A. The placement/buffer section P-BF1 has a pair of fixing members 91 extending in the vertical direction and a plurality of support plates 92. The pair of fixing members 91 is attached to the frames 911, 912, respectively.

A plurality of convex portions 921 projecting in the transverse direction (the X direction) are provided in each fixing member 91 at regular intervals in the vertical direction. One ends of the plurality of support plates 92 are fixed to upper surfaces and lower surfaces of the convex portions 921 of one fixing member 91, respectively, and the other ends of the plurality of support plates 92 are fixed to upper surfaces and lower surfaces of the convex portions 921 of the other fixing member 91, respectively. This causes the plurality of support plates 92 to be horizontally arranged at equal intervals in the vertical direction.

A plurality of (three in this example) support pins 93 are provided on an upper surface of each support plate 92. The substrate W is supported by the plurality of support pins 93 on each support plate 92. In this manner, the plurality of substrates W can be housed in the placement/buffer section P-BF1.

As shown in FIG. 10 (a) to (c), the hands H1, H2 of the transport mechanism 137 (FIG. 5), the hands H3, H4 of the transport mechanism 141 (FIG. 7) and the hands H5, H6 of the transport mechanism 142 (FIG. 7) each have a substantially U-shape.

This allows the hands H1 to H6 of the transport mechanisms 137, 141, 142 to place the substrate W on the support pins 93 and receive the substrate W from a portion above the support pins 93 without interfering the frames 911, 912 and the support pins 93.

As described above, the placement/buffer section P-BF1 is configured such that the substrates W can be carried in and out by the transport mechanisms 137, 141, 142. Similarly, the placement/buffer section P-BF2 is configured such that the substrates W can be carried in and out by the transport mechanisms 138, 141, 142.

Note that the substrate platform PASS9 (FIG. 5) may be configured in the same manner as the placement/buffer sections P-BF1, P-BF2.

(8) Details of the Placement/Cooling Section

Figure 11:
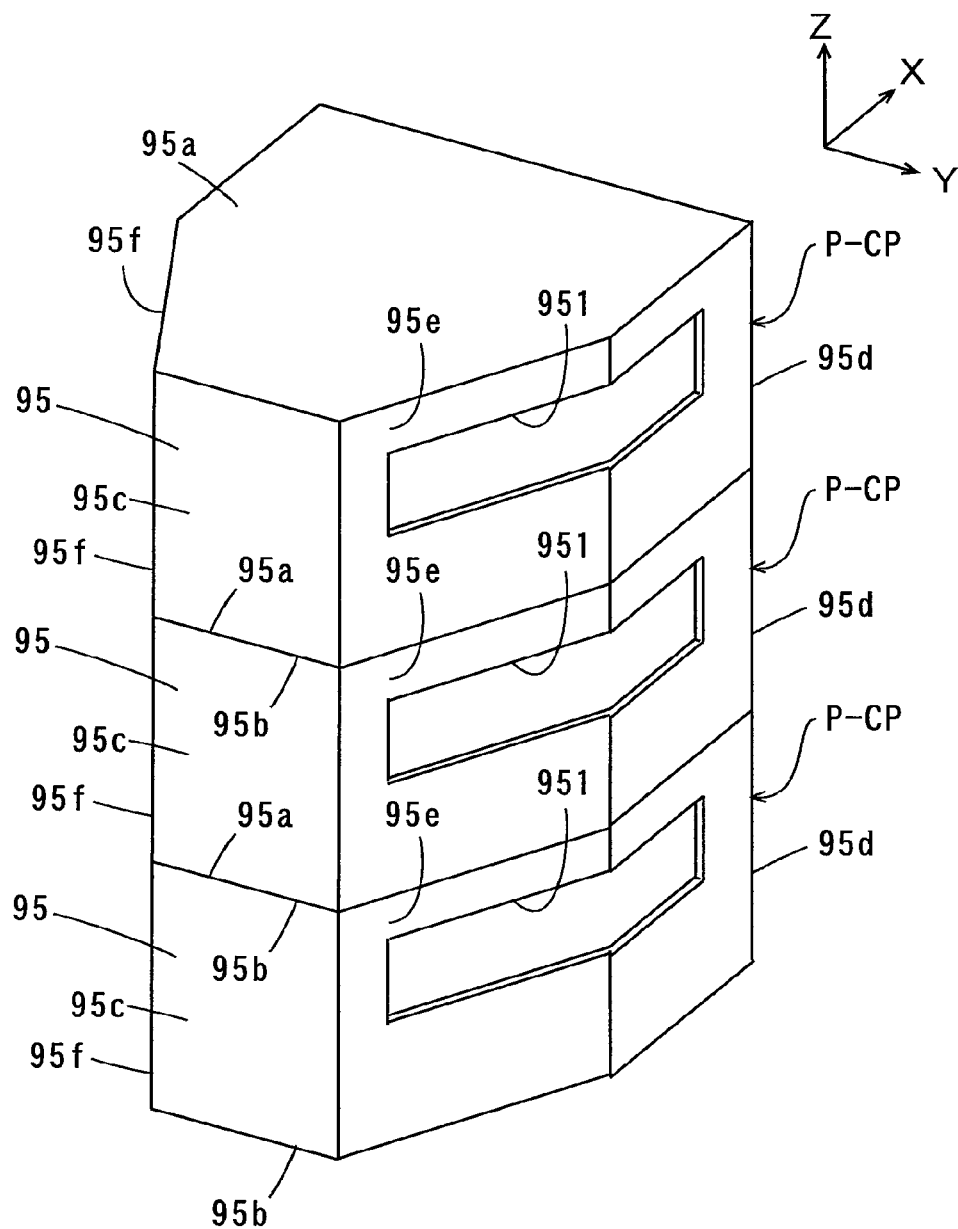
FIG. 11 is a perspective view showing the appearance of placement/cooling sections.
Figure 12:
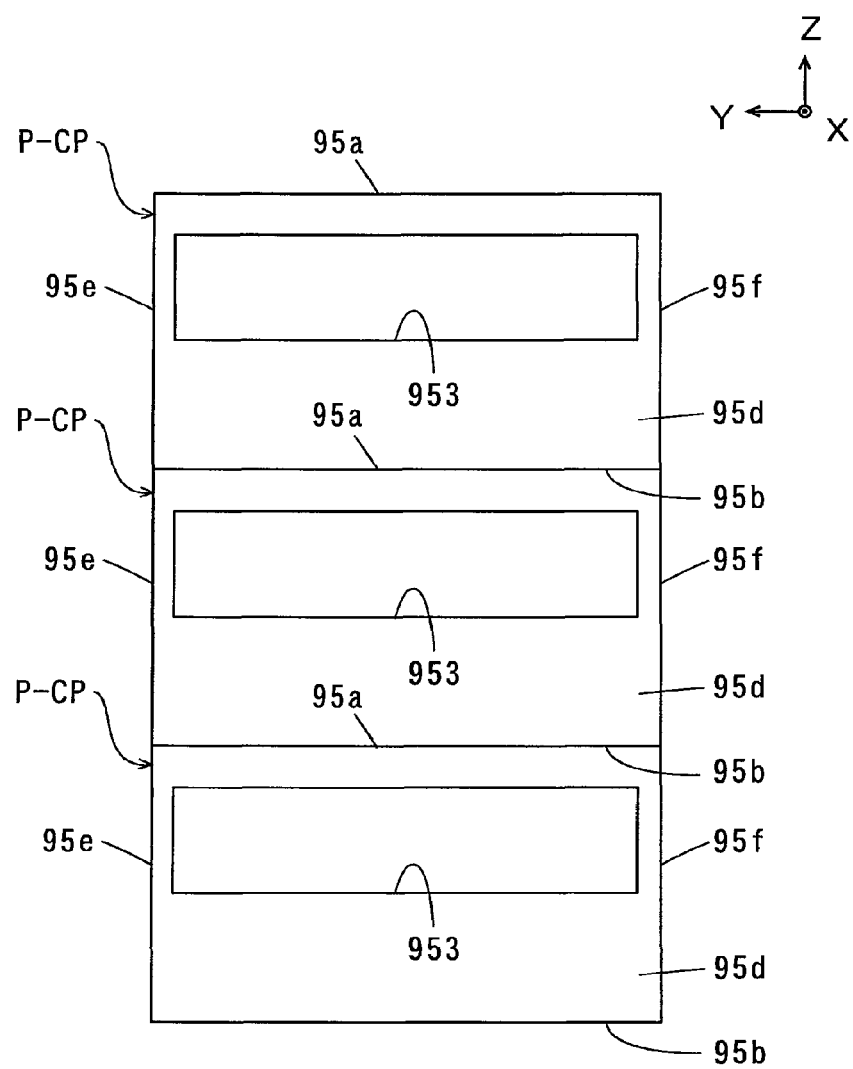
FIG. 12 is a diagram of the placement/cooling sections that is seen from a +X direction.
Figure 14:
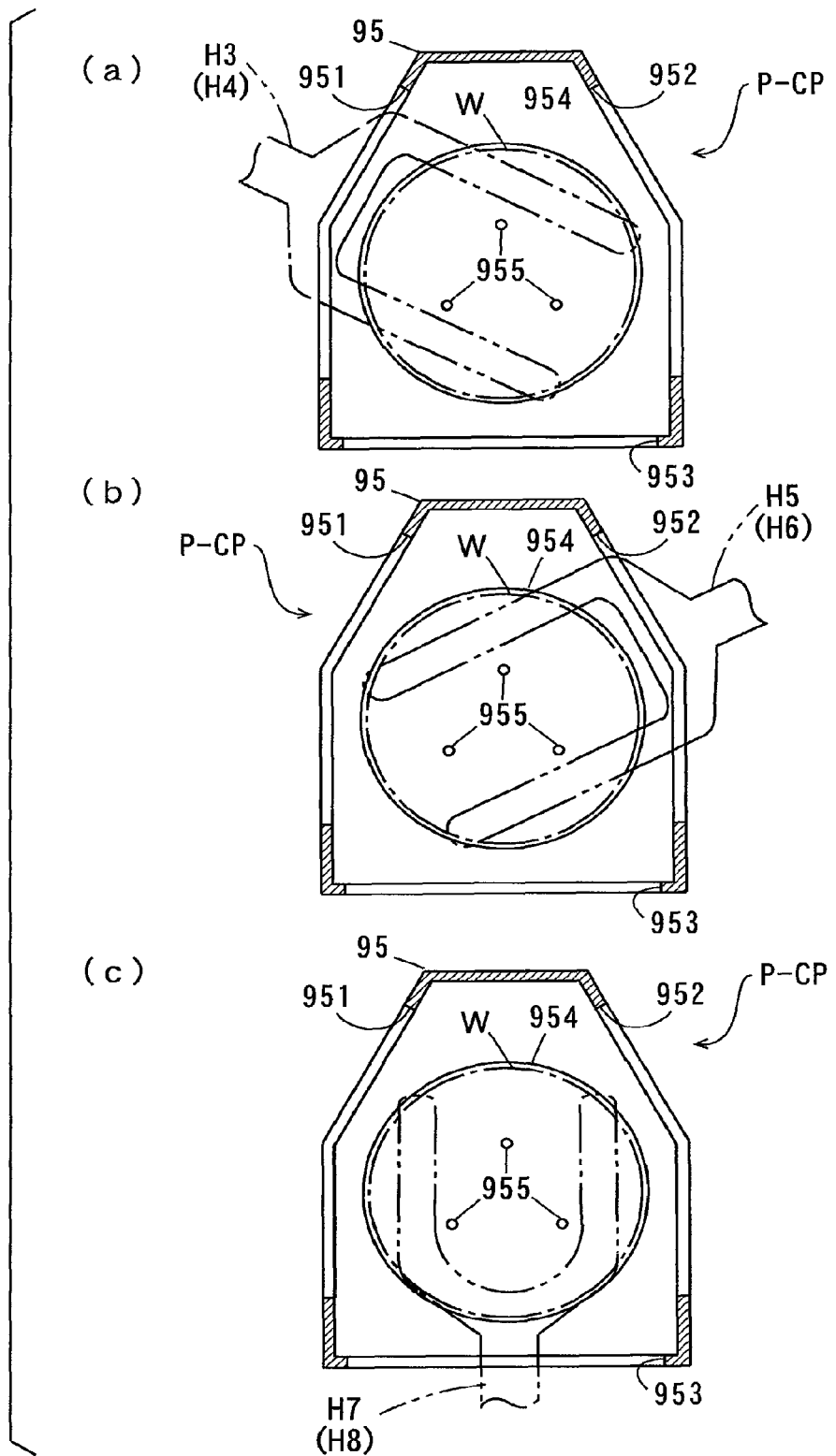
FIG. 14 is a schematic sectional view for explaining an operation of carrying the substrate W in and out of the placement/cooling section.

Description will be made of the detailed configuration of the placement/cooling sections P-CP. FIG. 11 is a perspective view showing the appearance of the placement/cooling sections P-CP. FIG. 12 is a diagram of the placement/cooling sections P-CP that are seen from the +X direction. FIG. 13 is a schematic transverse sectional view of the placement/cooling section P-CP. FIG. 14 is a schematic sectional view for explaining an operation of carrying the substrate W in and out of the placement/cooling section P-CP. FIGS. 11 and 12 show the three placement/cooling sections P-CP that are vertically stacked.

As shown in FIG. 11, each placement/cooling section P-CP has a housing 95. The housing 95 includes an upper surface portion 95a, a lower surface portion 95b, a front surface portion 95c, a rear surface portion 95d and side surface portions 95e, 95f. The upper surface portion 95a and the lower surface portion 95b are in parallel with the XY plane, and the front surface portion 95c and the rear surface portion 95d are in parallel with the YZ plane.

The side surface portions 95e, 95f extend along the XZ plane from both ends of the rear surface portion 95d, respectively, and are bent inward so as to be close to each other to be integrated with both ends of the front surface portion 95c, respectively.

A substrate carry-in opening 951 extending in the transverse direction is formed in the side surface portion 95e, and a substrate carry-in opening 952 (see FIG. 13, described below) extending in the transverse direction is formed in the side surface portion 95f. As shown in FIG. 12, a substrate carry-out opening 953 extending in the transverse direction (the Y direction) is formed in the rear surface portion 95d.

As shown in FIG. 13, a cooling plate 954 is provided inside each housing 95. The cooling plate 954 is cooled by a cooling mechanism that is not shown. A plurality of (three in this example) support pins 955 are provided on the cooling plate 954. The substrate W is placed on the support pins 955.

Note that shutters for opening/closing the substrate carry-in openings 951, 952 and the substrate carry-out opening 953 may be provided.

As shown in FIG. 14 (a), the hands H3, H4 of the transport mechanism 141 (FIG. 7) can enter the housing 95 from the substrate carry-in opening 951, and place the substrate W on the support pins 955. As shown in FIG. 14 (b), the hands H5, H6 of the transport mechanism 142 (FIG. 7) can enter the housing 95 from the substrate carry-in opening 952, and place the substrate W on the support pins 955.

As shown in FIG. 14 (c), the hands H7, H8 of the transport mechanisms 146 (FIG. 5) can enter the housing 95 from the substrate carry-out opening 953, and hold and carry the substrate W on the support pins 955 out of the placement/cooling section P-CP.

In this manner, the placement/cooling section P-CP is configured such that the substrate W can be carried in and out by the transport mechanisms 141, 142 and 146.

As described above, the substrate W is carried in the placement/cooling section P-CP by the hand H4 of the transport mechanism 141 in the present embodiment. The substrate W placed on the support pins 955 is cooled to the temperature suitable for the exposure processing by the cooling plate 954. Then, the substrate W after the cooling processing is carried out of the placement/cooling section P-CP by the hand H7 of the transport mechanism 146 (FIG. 7).

(9) Effects of the Present Embodiment (9-1)

The transport mechanism 141 can transport the substrates W among the placement/buffer sections P-BF1, P-BF2, the cleaning/drying processing section 161 and the placement/cooling sections P-CP, and the transport mechanism 142 can transport the substrates W among the placement/buffer sections P-BF1, P-BF2, the cleaning/drying processing section 162, the thermal processing section 133 and the placement/cooling sections P-CP in the cleaning/drying processing block 14A in the present embodiment.

This allows a wider choice of transport paths of the substrates W to be available in the cleaning/drying processing block 14A. Accordingly, the substrates can be transported through optimum paths depending on how the substrates W are to be processed in the first and second processing blocks 12, 13 and the cleaning/drying processing sections 161, 162. This allows transport efficiency of the substrates W to be increased, resulting in improved throughput.

(9-2)

In the present embodiment, the substrates W before the exposure processing are transported by the transport mechanism 141, and the substrates W after the exposure processing are transported by the transport mechanism 142 in the cleaning/drying processing block 14A. Moreover, the substrates W before the exposure processing are transported by the hand H7 of the transport mechanism 146, and the substrates W after the exposure processing are transported by the hand H8 of the transport mechanism 146 in the carry-in/carry-out block 14B.

In this manner, respective transport paths are independently ensured for the substrates W before the exposure processing and the substrates W after the exposure processing in the cleaning/drying processing block 14A and the carry-in/carry-out block 14B. In this case, the operations of the transport mechanisms 141, 142, 146 are more simplified than the case of complicated transport paths for the substrates W before the exposure processing and the substrates W after the exposure processing. This allows transport efficiency of the substrates W to be increased, resulting in improved throughput.

(9-3)

In the cleaning/drying processing block 14A, the substrates W before the exposure processing are transported from the placement/buffer sections P-BF1, P-BF2 to the placement/cooling sections P-CP via the cleaning/drying processing section 161 by the transport mechanism 141, and the substrates W after the exposure processing are transported from the substrate platform PASS9 to the upper stage thermal processing portion 303 or the lower stage thermal processing portion 304 via the cleaning/drying processing section 162 by the transport mechanism 142. Moreover, the substrates W before the exposure processing are transported from the placement/cooling section P-CP to the exposure device 15 by the hand H7 of the transport mechanism 146, and the substrates W after the exposure processing are transported from the exposure device 15 to the substrate platform PASS9 by the hand H8 of the transport mechanism 146 in the carry-in/carry-out block 14B.

Thus, the substrates W before the exposure processing and the substrates W after the exposure processing are not brought into indirect contact with one another in the cleaning/drying processing block 14A and the carry-in/carry-out block 14B. This prevents cross-contamination between the substrates W before the exposure processing and the substrates W after the exposure processing.

(9-4)

Furthermore, the respective transport paths are independently provided for the substrates W before the exposure processing and the substrates W after the exposure processing, so that the substrates W after the exposure processing can be smoothly transported to the thermal processing units PHP of the second processing block 13.

Thus, the substrates W can be quickly subjected to the PEB processing after the exposure processing. As a result, a chemical reaction within the resist film can be immediately promoted to allow a desired exposure pattern to be obtained. In addition, a time period from the exposure processing to the PEB processing can be made substantially constant when the plurality of substrates W are successively processed. This results in prevention of variation in the accuracy of the exposure pattern.

(9-5)

Moreover, the transport mechanisms 137, 141, 142 can carry the substrates W in and out of the placement/buffer section P-BF1, and the transport mechanisms 138, 141, 142 can carry the substrates W in and out of the placement/buffer section P-BF2. Accordingly, the substrates W can be housed in the placement/buffer sections P-BF1, P-BF2 at various timings before and after the exposure processing. As a result, timings at which the substrates W are transported by the transport mechanisms 137, 138, 141, 142 can be easily adjusted.

Furthermore, the transport mechanisms 141, 142, 146 can carry the substrates W in and out of the substrate platform PASS9 and the placement/cooling sections P-CP. In this case, the substrates W can be carried in and out of the placement/buffer sections P-BF1, P-BF2, the substrate platforms PASS9 and the placement/cooling sections P-CP from three directions, so that the transport paths of the substrates W can be easily changed.

(9-6)

In the first and second processing blocks 12, 13, the plurality of substrates W can be concurrently processed in the processing section on the upper stage (the coating processing chambers 21, 22, 32, the development processing chamber 31 (FIG. 2), the upper stage transport chambers 125, 135 (FIG. 5) and the upper stage thermal processing portions 301, 303 (FIG. 3)) and the processing section on lower stage (the coating processing chambers 23, 24, 34, the development processing chamber 33 (FIG. 2), the lower stage transport chambers 126, 136 (FIG. 5) and the lower stage thermal processing portions 302, 304 (FIG. 3)).

Accordingly, the throughput of the first and second processing blocks 12, 13 can be improved without increasing the transport speed of the substrates W by the transport mechanisms 127, 128, 137, 138. Moreover, the transport mechanisms 127, 128 are provided one above the other and the transport mechanisms 137, 138 are provided one above the other, thus preventing the increase of footprint of the substrate processing apparatus 100.

(9-7)

The processing section on the upper stage and the processing section on the lower stage in the first and second processing blocks 12, 13 have the equal configurations. Thus, even when a failure or the like occurs in one of the processing section on the upper stage and the processing section on the lower stage, the processing of the substrates W can be continued in the other processing section. This results in improved flexibility of the substrate processing apparatus 100.

(9-8)

In the cleaning/drying processing units SD1, the substrates W before the exposure processing are subjected to the cleaning processing, so that part of components of the resist cover film on the substrates W are eluted to be washed. Therefore, even though the substrates W come in contact with a liquid in the exposure device 15, the components of the resist cover film on the substrates W are hardly eluted in the liquid. Moreover, dust or the like adhering to the substrates W before the exposure processing can be removed. As a result, contamination in the exposure device 15 is prevented.

(9-9)

The liquid that has adhered to the substrates W during the cleaning processing is removed by subjecting the substrates W after the cleaning processing to the drying processing in the cleaning/drying processing units SD1, so that dust or the like in the atmosphere is prevented from again adhering to the substrates W after the cleaning processing. As a result, contamination in the exposure device 15 can be reliably prevented.

(9-10)

The substrates W after the exposure processing are subjected to the drying processing in the cleaning/drying processing units SD2, thereby preventing a liquid that has adhered to the substrates W during the exposure processing from dropping in the substrate processing apparatus 100. In addition, the substrates W after the exposure processing are subjected to the drying processing to prevent dust or the like in the atmosphere from adhering to the substrates W after the exposure processing. Thus, contamination of the substrates W can be prevented.

The substrates W to which the liquid has adhered can be prevented from being transported to the substrate processing apparatus 100 to inhibit the liquid that has adhered to the substrates W during the exposure processing from affecting the atmosphere in the substrate processing apparatus 100. This causes the temperature and humidity in the substrate processing apparatus 100 to be easily adjusted.

(9-11)

The liquid that has adhered to the substrates W during the exposure processing are prevented from adhering to the transport mechanisms 116, 127, 128, 137, 138, 141, 142. Therefore, the liquid is prevented from adhering to the substrates W before the exposure processing. Thus, dust or the like in the atmosphere is prevented from adhering to the substrates W before the exposure processing, so that contamination of the substrate W is prevented. As a result, degradation in resolution performance at the time of the exposure processing can be prevented and contamination in the exposure device 15 can be prevented. In addition, components of the resist or components of the resist cover film can be reliably prevented from being eluted in the liquid that remains on the substrates W while the substrates W are transported from the cleaning/drying processing units SD2 to the development processing chambers 31, 33. This prevents deformation of the exposure patterns formed on the resist films. As a result, degradation in accuracy of line width during the development processing can be reliably prevented.

(10) Modifications

Description will be made of modifications of the above-described embodiment.

(10-1) First Modification

Figure 15:
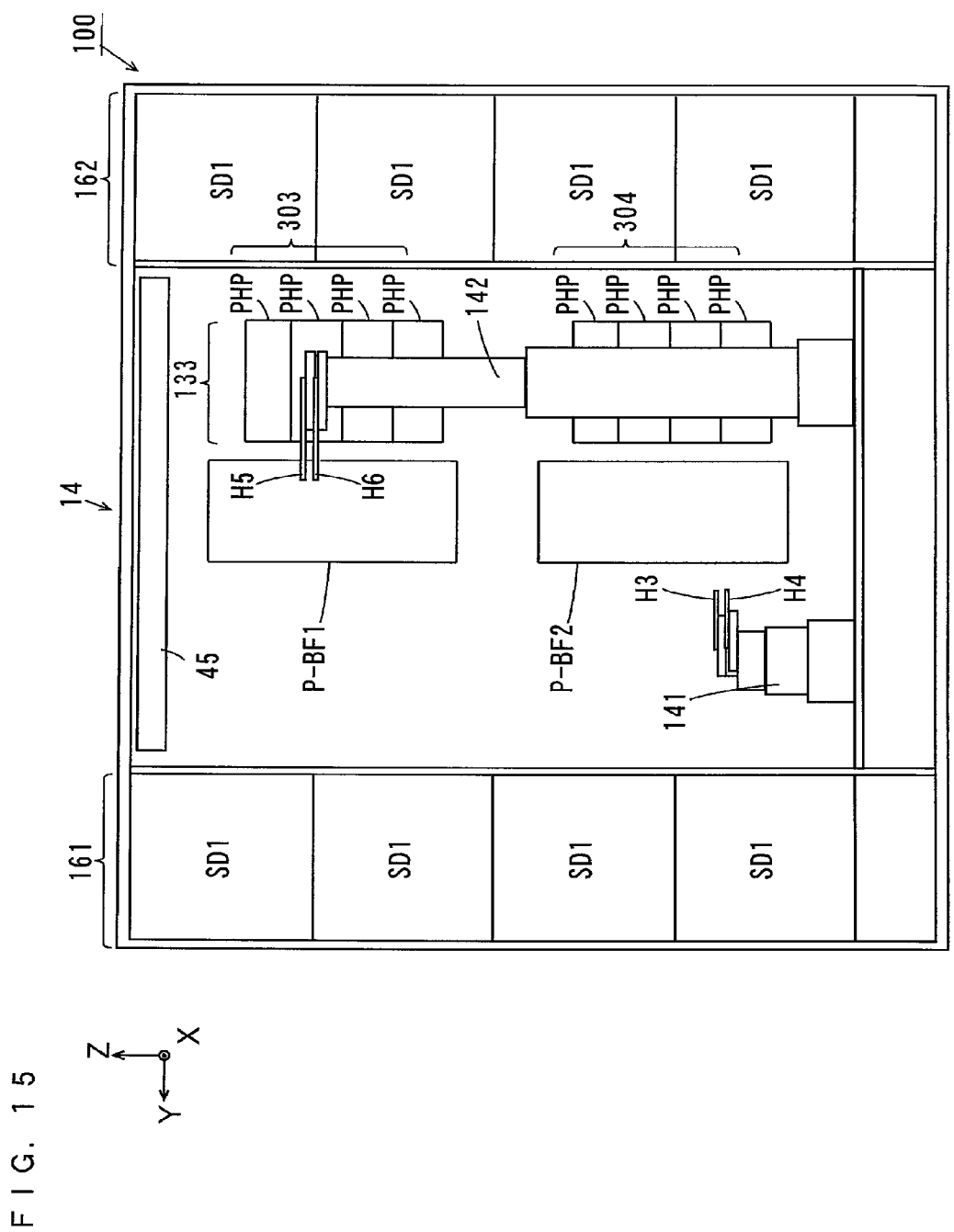
FIG. 15 is a diagram showing the internal configuration of the cleaning/drying processing block in a first modification.

A first modification is described while referring to differences from the foregoing embodiment. FIG. 15 is a diagram showing the internal configuration of the cleaning/drying processing block 14A in the first modification. Note that FIG. 15 is a diagram of the cleaning/drying processing block 14A that is seen from the +X direction.

As shown in FIG. 15, the plurality of (four in this example) cleaning/drying processing units SD1 are provided in each of the cleaning/drying processing sections 161, 162 in the first modification.

One example of the transport paths of the substrates W in the cleaning/drying processing block 14A of FIG. 15 is described mainly referring to FIGS. 5 and 15.

The substrate W after the edge exposure placed in the placement/buffer section P-BF1 by the transport mechanism 137 (FIG. 5) is transported to a predetermined cleaning/drying processing unit SD1 of the cleaning/drying processing section 161 by the transport mechanism 141 (FIG. 15). The substrate W subjected to the cleaning processing and the drying processing in the cleaning/drying processing unit SD1 of the cleaning/drying processing section 161 is transported to the placement/cooling section P-CP (FIG. 5) by the transport mechanism 141.

The substrate W after the edge exposure placed in the placement/buffer section P-BF2 by the transport mechanism 138 (FIG. 5) is transported to a predetermined cleaning/drying processing unit SD1 of the cleaning/drying processing section 162 by the transport mechanism 142 (FIG. 15). The substrate W subjected to the cleaning processing and the drying processing in the cleaning/drying processing unit SD1 of the cleaning/drying processing section 162 is transported to the placement/cooling section P-CP (FIG. 5) by the transport mechanism 142.

The substrates W after the exposure processing placed in the substrate platform PASS9 by the transport mechanism 146 (FIG. 5) are transported to the thermal processing unit PHP of the upper stage thermal processing portion 303 and the thermal processing unit PHP of the lower stage thermal processing portion 304 by the transport mechanism 142 (FIG. 15)

As described above, the substrates W before the exposure processing are subjected to the cleaning processing and the drying processing in both the cleaning/drying processing sections 161, 162 in the first modification. This improves the efficiency of the cleaning processing and the drying processing of the substrates W before the exposure processing. Accordingly, when the cleaning processing and the drying processing after the exposure processing are not required, a significant number of substrates W can be more quickly processed.

Note that the back surfaces and ends of the substrates W are subjected to the cleaning processing in some cases during the cleaning processing and the drying processing of the substrates W before the exposure processing, as described above. In the case, a processing time period is increased to degrade the throughput.

Therefore, the substrates W before the exposure processing are subjected to the cleaning processing and the drying processing in both the cleaning/drying processing sections 161, 162 as described in this example, thereby suppressing the degradation of the throughput due to the increase of the processing time period.

In the first modification, one of the hands H5, H6 may be used in transportation of the substrates W before the exposure processing by the transport mechanism 142, and the other of the hands H5, H6 may be used in transportation of the substrates W after the exposure processing by the transport mechanism 142. In this case, the substrates W before the exposure processing and the substrates W after the exposure processing are prevented from coming in indirect contact with one another through the transport mechanism 142. This inhibits cross-contamination between the substrates W before the exposure processing and the substrates W after the exposure processing.

(10-2) Second Modification

Figure 16:
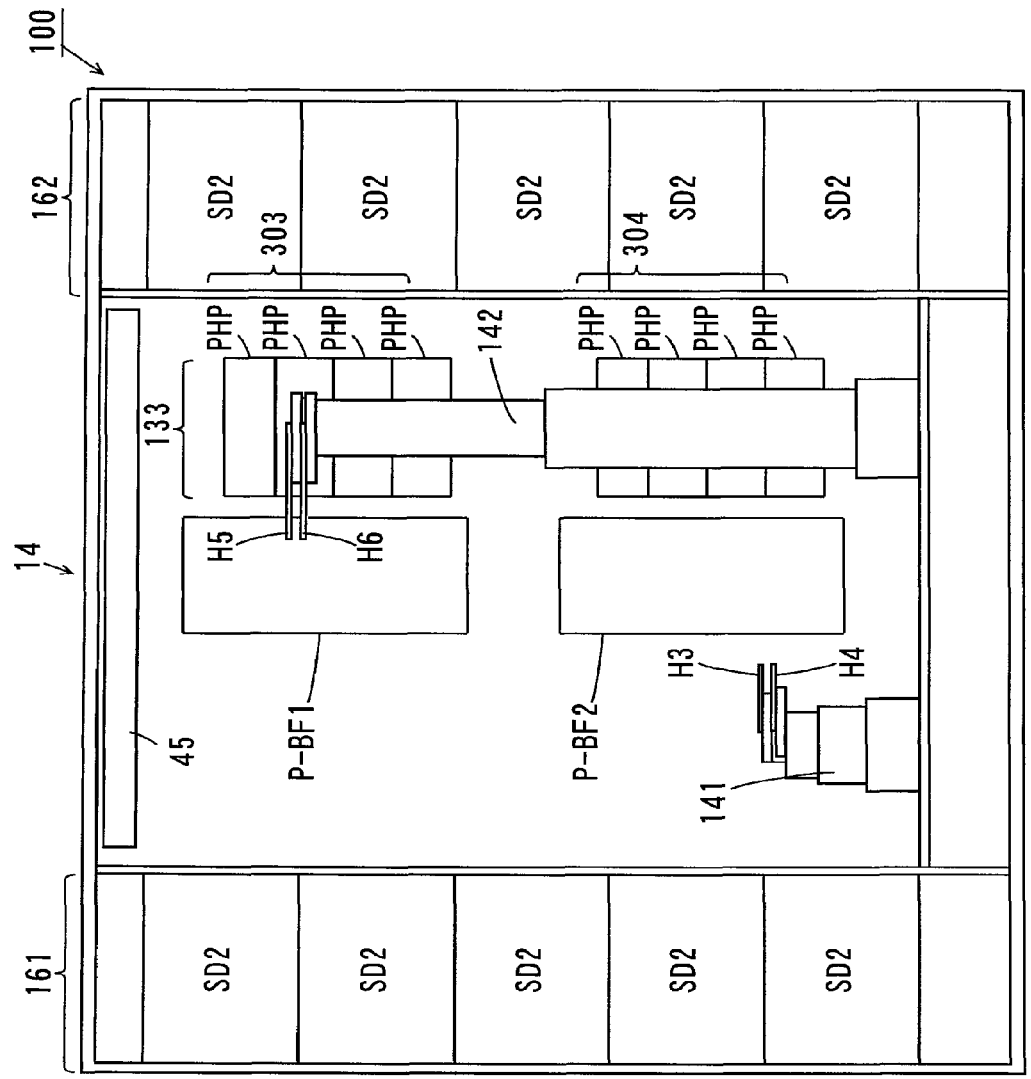
FIG. 16 is a diagram showing the internal configuration of the cleaning/drying processing block in a second modification.

A second modification is described while referring to differences from the foregoing embodiment. FIG. 16 is a diagram showing the internal configuration of the cleaning/drying processing block 14A in the second modification. Note that FIG. 16 is a diagram of the cleaning/drying processing block 14A that is seen from the +X direction.

As shown in FIG. 16, the plurality of (five in this example) cleaning/drying processing units SD2 are provided in each of the cleaning/drying processing sections 161, 162 in the second modification.

One example of the transport paths of the substrates W in the cleaning/drying processing block 14A of FIG. 16 is described mainly referring to FIGS. 5 and 16.

The substrates W after the edge exposure placed in the placement/buffer sections P-BF1, P-BF2 by the transport mechanisms 137, 138 (FIG. 5) are transported to the placement/cooling sections P-CP (FIG. 5) by the transport mechanisms 141, 142 (FIG. 16).

The substrates W after the exposure processing placed in the substrate platform PASS9 by the transport mechanism 146 (FIG. 5) are transported to the cleaning/drying processing units SD2 of the cleaning/drying processing section 161 by the transport mechanism 141 (FIG. 16) or transported to the cleaning/drying processing units SD2 of the cleaning/drying processing section 162 by the transport mechanism 142.

The substrates W subjected to the cleaning processing and the drying processing in the cleaning/drying processing units SD2 of the cleaning/drying processing section 161 are transported to the substrate platform PASS9 (FIG. 5) by the transport mechanism 141. The substrates W transported to the substrate platform PASS9 are transported to the thermal processing units PHP of the upper stage thermal processing portion 303 or the thermal processing units PHP of the lower stage thermal processing portion 304 by the transport mechanism 142 (FIG. 16).

The substrates W subjected to the cleaning processing and the drying processing in the cleaning/drying processing units SD2 of the cleaning/drying processing section 162 are transported to the thermal processing units PHP of the upper stage thermal processing portion 303 or the lower stage thermal processing portion 304 by the transport mechanism 142.

In this manner, the substrates W after the exposure processing are subjected to the cleaning processing and the drying processing in both the cleaning/drying processing sections 161, 162 in the second modification. This improves the efficiency of the cleaning processing and the drying processing of the substrates W after the exposure processing. Accordingly, when the cleaning processing and the drying processing before the exposure processing are not required, a significant number of substrates W can be more quickly processed.

In addition, one of the hands H3, H4 may be used in transportation of the substrates W before the exposure processing by the transport mechanism 141, the other of the hands H3, H4 may be used in transportation of the substrates W after the exposure processing by the transport mechanism 141, one of the hands H5, H6 may be used in transportation of the substrates W before the exposure processing by the transport mechanism 142, and the other of the hands H5, H6 may be used in transportation of the substrates W after the exposure processing by the transport mechanism 142 in the second modification. In this case, the substrates W before the exposure processing and the substrates W after the exposure processing are prevented from coming in indirect contact with one another through the transport mechanisms 141, 142. This prevents cross-contamination between the substrates W before the exposure processing and the substrates W after the exposure processing.

(10-3) Third Modification

Figure 17:
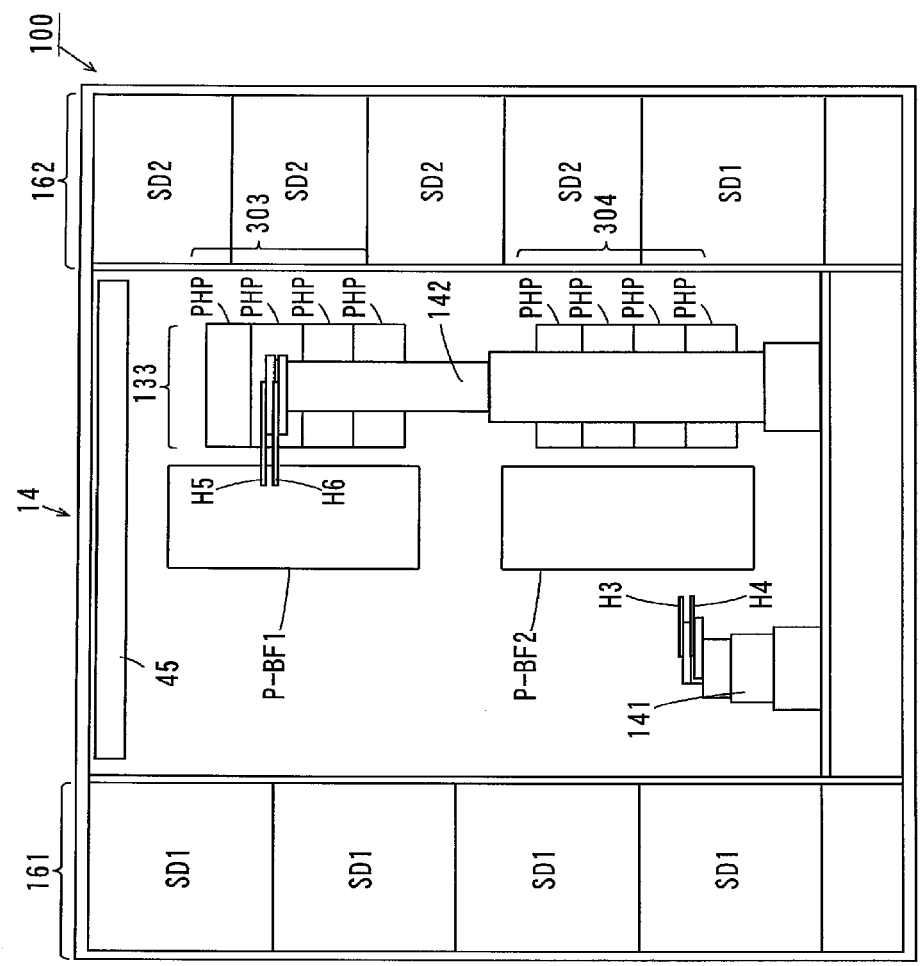
FIG. 17 is a diagram showing the internal configuration of the cleaning/drying processing block in a third modification.

A third modification is described while referring to differences from the foregoing embodiment. FIG. 17 is a diagram showing the internal configuration of the cleaning/drying processing block 14A in the third modification. Note that FIG. 17 is a diagram of the cleaning/drying processing block 14A that is seen from the +X direction.

As shown in FIG. 17, the plurality of (four in this example) cleaning/drying processing units SD1 are provided in the cleaning/drying processing section 161, and one or a plurality of (one in this example) cleaning/drying processing unit SD1 and the plurality of (four in this example) cleaning/drying processing units SD2 are provided in the cleaning/drying processing section 162 in the third modification.

One example of the transport paths of the substrates W in the cleaning/drying processing block 14A is described mainly referring to FIGS. 5 and 17.

The substrates W after the edge exposure placed in the placement/buffer sections P-BF1, P-BF2 by the transport mechanisms 137, 138 (FIG. 5) are transported to the cleaning/drying processing units SD1 of the cleaning/drying processing section 161 by the transport mechanism 141 (FIG. 17) or transported to the cleaning/drying processing unit SD1 of the cleaning/drying processing section 162 by the transport mechanism 142.

The substrates W subjected to the cleaning processing and the drying processing in the cleaning/drying processing units SD1 of the cleaning/drying processing section 161 are transported to the placement/cooling sections P-CP (FIG. 5) by the transport mechanism 141. Moreover, the substrates W subjected to the cleaning processing and the drying processing in the cleaning/drying processing unit SD1 of the cleaning/drying processing section 162 (FIG. 17) are transported to the placement/cooling sections P-CP (FIG. 5) by the transport mechanism 142.

The substrates W after the exposure processing placed in the substrate platform PASS9 by the transport mechanism 146 (FIG. 5) are transported to the cleaning/drying processing units SD2 of the cleaning/drying processing section 162 by the transport mechanism 142 (FIG. 17). The substrates W subjected to the cleaning processing and the drying processing in the cleaning/drying processing units SD2 of the cleaning/drying processing section 162 are transported to the thermal processing units PHP (FIG. 17) of the upper stage thermal processing portion 303 or the lower stage thermal processing portion 304 by the transport mechanism 142.

As described above, the substrates W before the exposure processing are subjected to the cleaning processing and the drying processing in both the cleaning/drying processing sections 161, 162, and the substrates W after the exposure processing are subjected to the cleaning processing and the drying processing in the cleaning/drying processing section 162 in the third modification.

As described above, the processing time period is increased when the back surfaces and ends of the substrates W are subjected to the cleaning processing during the cleaning processing and the drying processing of the substrates W before the exposure processing. Thus, a longer time period is required for the cleaning processing and the drying processing of the substrates W before the exposure processing than a time period required for the cleaning processing and the drying processing of the substrates W after the exposure processing. Therefore, as described in this example, the larger number of the cleaning/drying processing units SD1 than the number of the cleaning/drying processing units SD2 allows the substrates W before and after the exposure processing to be efficiently subjected to the cleaning processing and the drying processing.

The cleaning/drying processing unit SD1 is increased in size if a mechanism for subjecting the back surfaces and ends of the substrates W to the cleaning processing is provided in the cleaning/drying processing unit SD1. This inhibits provision of a large number of cleaning/drying processing units SD1 in the cleaning/drying processing section 161. Therefore, the cleaning/drying processing unit SD1 is provided also in the cleaning/drying processing section 162 to ensure a sufficient number of cleaning/drying processing units SD1.

In the third modification, one of the hands H5, H6 may be used in transportation of the substrates W before the exposure processing by the transport mechanism 142, and the other of the hands H5, H6 may be used in transportation of the substrates W after the exposure processing by the transport mechanism 142. In this case, the substrates W before the exposure processing and the substrates W after the exposure processing are prevented from coming in indirect contact with one another through the transport mechanism 142. This prevents cross-contamination between the substrates W before the exposure processing and the substrates W after the exposure processing.

(10-4) Other Modifications

Another unit may be provided instead of the cleaning/drying processing units SD1, SD2. For example, a unit for testing the presence/absence of contamination in the ends of the substrates W before and after the exposure processing may be provided, and a unit for testing states of the films on the substrates W before and after the exposure processing may be provided.

(11) Correspondences between Elements in the Claims and Parts in Embodiments

In the following paragraphs, non-limiting examples of correspondences between various elements recited in the claims below and those described above with respect to various preferred embodiments of the present invention are explained.

In the foregoing embodiments, the first and second processing blocks 12, 13 are examples of a processing section, the interface block 14 is an example of an interface, the placement/buffer sections P-BF1, P-BF2 are examples of a first placement section, the placement/cooling section P-CP and the substrate platform PASS9 are examples of a second placement section, the cleaning/drying processing section 161 is an example of a first processing region, and the cleaning/drying processing section 162 is an example of a second processing region.

The hands H3, H4, H7 of the transport mechanisms 141, 146 are examples of a first substrate transport mechanism, the hands H5, H6, H8 of the transport mechanisms 142, 146 are examples of a second substrate transport mechanism, the cleaning/drying processing unit SD1 is an example of a cleaning processing unit, the cleaning/drying processing unit SD2 is an example of a drying processing unit, the cleaning/drying processing block 14A is an example of a processing block, the carry-in/carry-out block 14B is an example of a carry-in/carry-out block, the hands H3, H4 of the transport mechanism 141 are examples of a first substrate holder, the hand H7 of the transport mechanism 146 is an example of a second substrate holder, the hands H5, H6 of the transport mechanism 142 are examples of a third substrate holder, the hand H8 of the transport mechanism 146 is an example of a fourth substrate holder, the X direction is an example of a first direction, and the Y direction is an example of a second direction.

The coating processing chambers 32, 34 and the development processing chambers 31, 33 are examples of a plurality of processing chambers, the coating processing unit 129 and the development processing unit 139 are examples of a plurality of liquid processing units, the upper stage transport chamber 135 is an example of a first transport chamber, the lower stage transport chamber 136 is an example of a second transport chamber, the transport mechanisms 137, 138 are examples of a plurality of transport mechanisms for transport chambers, the coating processing chamber 32 and the development processing chamber 31 are examples of a first processing chamber group, the coating processing chamber 34 and the development processing chamber 33 are examples of a second processing chamber group, the placement/buffer section P-BF1 is an example of a first placement portion, the placement/buffer section P-BF2 is an example of a second placement portion, the transport mechanism 137 is an example of a first in-chamber transport mechanism, and the transport mechanism 138 is an example of a second in-chamber transport mechanism.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing method for processing a plurality of substrates in a substrate processing apparatus that is arranged adjacent to an exposure device and includes a processing section and an interface, the method comprising the steps of:

performing film formation processing of forming a photosensitive film made of a photosensitive material on each substrate in a film formation device of the processing section;

carrying each substrate after the film formation processing into a placement buffer including a plurality of supporters for supporting a plurality of substrates one above another by a first transport mechanism provided in the processing section, wherein each substrate is carried into any one of the plurality of supporters;

taking out each substrate after the film formation processing from the placement buffer to the interface by a second transport mechanism provided in the interface;

carrying each substrate after the film formation processing taken out from the placement buffer to the interface into the exposure device;

carrying each substrate after exposure processing by the exposure device out of the exposure device;

carrying each substrate after the exposure processing into any one of the supporters in the placement buffer by the second transport mechanism;

taking out each substrate after the exposure processing from the placement buffer to the processing section by the first transport mechanism;

performing development processing on each substrate after the exposure processing taken out from the placement buffer to the processing section in a developing device of the processing section;

selectively making one or a plurality of substrates stand by at the placement buffer depending on timing at which the exposure device can accept each substrate in a course of transporting each substrate from the processing section via the interface to the exposure device; and selectively making one or a plurality of substrates stand by at the placement buffer depending on timing at which the developing device can accept each substrate in a course of transporting each substrate from the exposure device via the interface to the developing device, wherein the placement buffer is provided and configured so as to enable the plurality of substrates to stand by simultaneously before the exposure processing by the exposure device, and to enable the plurality of substrates to stand by simultaneously after the exposure processing by the exposure device.

2. The substrate processing method according to claim 1, wherein the processing section includes an upper stage processing chamber and a lower stage processing chamber that are provided in a stacked manner, the placement buffer includes a placement buffer for the upper stage processing chamber and a placement buffer for the lower stage processing chamber that each include a plurality of supporters for supporting a plurality of substrates one above another, the first transport mechanism includes a first transport device provided in the upper stage processing chamber and a second transport device provided in the lower stage processing chamber, the step of carrying each substrate after the film formation processing into the placement buffer includes the steps of:

carrying the substrate after the film formation processing into any one of the supporters in the placement buffer for the upper stage processing chamber by the first transport device, and carrying the substrate after the film formation processing into any one of the supporters in the placement buffer for the lower stage processing chamber by the second transport device, the step of taking out each substrate after the film formation processing from the placement buffer includes taking out the substrate after the film formation processing alternately from the placement buffer for the upper stage processing chamber and from the placement buffer for the lower stage processing chamber by the second transport mechanism, the step of carrying each substrate after the exposure processing into the placement buffer includes carrying the substrate after the exposure processing alternately into any one of the supporters in the placement buffer for the upper stage processing chamber and into any one of the supporters in the placement buffer for the lower stage processing chamber by the second transport mechanism, and the step of taking out each substrate after the exposure processing from the placement buffer includes the steps of:

taking out the substrate after the exposure processing from the placement buffer for the upper stage processing chamber to the upper stage processing chamber by the first transport device, and taking out the substrate after the exposure processing from the placement buffer for the lower stage processing chamber to the lower stage processing chamber by the second transport device.

3. The substrate processing method according to claim 2, wherein the substrate processing apparatus further includes a carry-in/carry-out unit, the method further comprises the steps of:

taking out the substrate from a container placed on a container platform of the carry-in/carry-out unit by a third transport mechanism provided in the carry-in/carry-out unit; and transporting the substrate taken out from the container alternately into the upper stage processing chamber and the lower stage processing chamber, and the step of taking out each substrate after the film formation processing from the placement buffer includes conforming a sequence in which the plurality of substrates are taken out from the placement buffer for the upper stage processing chamber and the placement buffer for the lower stage processing chamber to a sequence in which the plurality of substrates are taken out from the container.

4. The substrate processing method according to claim 1, wherein the step of taking out each substrate after the film formation processing from the placement buffer includes taking out the substrate after the film formation processing from the placement buffer by a third transport device of the second transport mechanism, and the step of carrying each substrate after the exposure processing into the placement buffer includes carrying the substrate after the exposure processing into the placement buffer by a fourth transport device of the second transport mechanism.

5. A substrate processing method for processing a plurality of substrates in a substrate processing apparatus that is arranged adjacent to an exposure device and includes a processing section and an interface, the method comprising the steps of:

performing formation processing of a photosensitive film made of a photosensitive material on each substrate in a film formation device of the processing section;

carrying each substrate after the film formation processing into a placement buffer including a plurality of supporters for supporting a plurality of substrates one above another by a first transport mechanism provided in the processing section, wherein each substrate is carried into any one of the plurality of supporters;

taking out each substrate after the film formation processing from the placement buffer to the interface by a second transport mechanism provided in the interface;

carrying each substrate after the film formation processing taken out from the placement buffer to the interface into the exposure device;

carrying each substrate after exposure processing by the exposure device out of the exposure device;

carrying each substrate after the exposure processing into any one of the supporters in the placement buffer by the second transport mechanism;

taking out each substrate after the exposure processing from the placement buffer to the processing section by the first transport mechanism;

performing development processing on each substrate after the exposure processing taken out from the placement buffer to the processing section in a developing device of the processing section;

making each substrate stand by at the placement buffer based on timing at which the exposure device can accept each substrate in a course of transporting each substrate from the processing section via the interface to the exposure device; and making each substrate stand by at the placement buffer based on timing at which the developing device can accept each substrate in a course of transporting each substrate from the exposure device via the interface to the developing device, wherein the step of taking out each substrate after the film formation processing from the placement buffer includes taking out the substrate after the film formation processing from the placement buffer by a third transport device of the second transport mechanism, the step of carrying each substrate after the exposure processing into the placement buffer includes carrying the substrate after the exposure processing into the placement buffer by a fourth transport device of the second transport mechanism, the step of carrying each substrate after the film formation processing into the placement buffer includes transporting the substrate after the film formation processing in a first direction by the first transport mechanism, the step of taking out each substrate after the film formation processing from the placement buffer includes transporting the substrate after the film formation processing in a second direction that is inclined from the first direction to one side within a horizontal plane by the third transport device, the step of carrying each substrate after the exposure processing into the placement buffer includes transporting the substrate after the exposure processing in a third direction that is inclined from the first direction to another side within the horizontal plane by the fourth transport device, and the step of taking out each substrate after the exposure processing from the placement buffer includes transporting the substrate after the exposure processing in the first direction by the first transport mechanism.

6. A substrate processing method for processing a plurality of substrates in a substrate processing apparatus that is arranged adjacent to an exposure device and includes a processing section and an interface, the method comprising the steps of:

performing film formation processing of forming a photosensitive film made of a photosensitive material on each substrate in a film formation device of the processing section;

carrying each substrate after the film formation processing into a placement buffer including a plurality of supporters for supporting a plurality of substrates one above another by a first transport mechanism provided in the processing section, wherein each substrate is carried into any one of the plurality of supporters;

taking out each substrate after the film formation processing from the placement buffer to the interface by a second transport mechanism provided in the interface;

carrying each substrate after the film formation processing taken out from the placement buffer to the interface into the exposure device;

carrying each substrate after exposure processing by the exposure device out of the exposure device;

carrying each substrate after exposure processing into any one of the supporters in the placement buffer by the second transport mechanism;

taking out each substrate after the exposure processing from the placement buffer to the processing section by the first transport mechanism;

performing development processing on each substrate after the exposure processing taken out from the placement buffer to the processing section in a developing device of the processing section;

making each substrate stand by at the placement buffer based on timing at which the exposure device can accept each substrate in a course of transporting each substrate from the processing section via the interface to the exposure device; and making each substrate stand by at the placement buffer based on timing at which the developing device can accept each substrate in a course of transporting each substrate from the exposure device via the interface to the developing device, wherein the placement buffer further includes a pair of frames extending in a vertical direction, the plurality of supporters are attached to the pair of frames, respectively, such that the plurality of supporters overlap each other in the vertical direction, the step of carrying each substrate after the film formation processing into the placement buffer includes the steps of:

transporting the substrate after the film formation processing by the first transport mechanism such that the substrate passes between the pair of frames, and placing the substrate after the film formation processing on the one supporter by the first transport mechanism, and the step of taking out each substrate after the exposure processing from the placement buffer includes the steps of:

receiving the substrate after the exposure processing placed on the one supporter by the first transport mechanism, and transporting the received substrate after the exposure processing by the first transport mechanism such that the received substrate passes between the pair of frames.

\* \* \* \* \*